(12) United States Patent
Weis

(10) Patent No.: US 7,921,391 B2
(45) Date of Patent: Apr. 5, 2011

(54) APPARATUS, METHOD AND COMPUTER-READABLE CODE FOR AUTOMATED DESIGN OF PHYSICAL STRUCTURES OF INTEGRATED CIRCUITS

(75) Inventor: Eran Weis, Even Yehuda (IL)

(73) Assignee: Daro Semiconductors Ltd., Tel Aviv (IL)

( * ) Notice: Subject to any disclaimer, the term of this patent is extended or adjusted under 35 U.S.C. 154(b) by 684 days.

(21) Appl. No.: 11/915,852

(22) PCT Filed: Jun. 4, 2006

(86) PCT No.: PCT/IL2006/000642
§ 371 (c)(1),
(2), (4) Date: Nov. 29, 2007

(87) PCT Pub. No.: WO2006/129319
PCT Pub. Date: Dec. 7, 2006

(65) Prior Publication Data
US 2010/0131907 A1     May 27, 2010

Related U.S. Application Data

(60) Provisional application No. 60/686,437, filed on Jun. 2, 2005.

(51) Int. Cl.
*G06F 17/50* (2006.01)
(52) U.S. Cl. ............ 716/110; 716/55; 716/56; 716/119; 716/126; 716/132
(58) Field of Classification Search .................. None
See application file for complete search history.

(56) References Cited

U.S. PATENT DOCUMENTS

| | | | |
|---|---|---|---|
| 5,014,226 A | | 5/1991 | Horstmann et al. |
| 5,742,510 A | | 4/1998 | Rostoker et al. |
| 5,930,500 A | * | 7/1999 | Scepanovic et al. ............ 716/13 |
| 6,308,302 B1 | * | 10/2001 | Hathaway et al. ................ 716/5 |
| 6,311,315 B1 | * | 10/2001 | Tamaki ............................ 716/7 |
| 6,543,041 B1 | * | 4/2003 | Scheffer et al. ................ 716/10 |
| 6,725,433 B1 | * | 4/2004 | Hau-Riege et al. .............. 716/4 |
| 6,763,508 B2 | * | 7/2004 | Igarashi et al. .................. 716/8 |
| 6,823,500 B1 | * | 11/2004 | Ganesh et al. .................... 716/9 |
| 6,996,797 B1 | | 2/2006 | Liebmann et al. |
| 7,080,329 B1 | * | 7/2006 | Teig et al. ......................... 716/2 |
| 7,100,134 B2 | * | 8/2006 | Wu et al. .......................... 716/5 |
| 7,112,982 B2 | * | 9/2006 | Honda et al. .................. 324/765 |
| 7,155,689 B2 | * | 12/2006 | Pierrat et al. ..................... 716/4 |
| 7,225,423 B2 | * | 5/2007 | Bhattacharya et al. ......... 716/18 |
| 7,383,521 B2 | * | 6/2008 | Smith et al. ...................... 716/6 |
| 7,398,489 B2 | * | 7/2008 | Dinter et al. ..................... 716/4 |
| 7,401,333 B2 | * | 7/2008 | Vandeweerd ................ 718/102 |
| 7,539,952 B2 | * | 5/2009 | Watanabe et al. ................ 716/1 |
| 7,730,439 B2 | * | 6/2010 | Saito et al. ....................... 716/8 |
| 7,735,029 B2 | * | 6/2010 | Riviere-Cazaux ............... 716/2 |

OTHER PUBLICATIONS

P.S. Ho and C-K. Hu, IBM Technical Disclosure Bulletin, "Current Density-Line Length Design Criterion for Multi-Layered Interconnects," vol. 35, No. 5, Oct. 1992, pp. 257-258.*

* cited by examiner

*Primary Examiner* — Leigh Marie Garbowski
(74) *Attorney, Agent, or Firm* — Mark M. Friedman

(57) ABSTRACT

Apparatus, methods, and computer readable code for computing parameters related to layout schemes of integrated circuits are disclosed herein. In some embodiments, an actual layout scheme is computed, for example, for a netlist. In some embodiments, one o or more layout schemes are scored based on, for example, susceptibility to failure and/or yield in manufacturing.

29 Claims, 22 Drawing Sheets

APPARATUS, METHOD AND COMPUTER-READABLE CODE FOR AUTOMATED DESIGN OF PHYSICAL STRUCTURES OF INTEGRATED CIRCUITS

FIELD OF THE INVENTION

The present invention relates to apparatus, methods and computerized code for the automated design of integrated circuits.

BACKGROUND

Methods and apparatus for automated circuit design are known in the art. Typically, these aforementioned methods and apparatus generate a layout design by effecting placement and routing of a hardware components specified in a netlist, for example, provided in a hardware description language.

A number of electronic design automation (EDA) software packages are available for computer-aided design of integrated circuits are available, including packages from Magma (Santa Clara, Calif.), Cadence (San Jose, Calif.) and Mentor (Wilsonville, Oreg.).

Typically, placement and routing are carried out in accordance with a number of design goals, including a desire to minimize wire length of conducting connectors between various electronic components, a need to minimize power consumption, a need to minimize congestion, and a need to minimize the area of wafer required to fabricate the device.

Unfortunately, many devices produced using these aforementioned techniques are prone to failure. Thus, devices susceptible to failure may be rejected during the manufacturing process, thereby decreasing yield. It would be highly advantageous to have apparatus and methods for generating layout designs that are less susceptible to device failure, thereby incorporating DFM (design for manufacturing) and DFY (design for yield) considerations into the placement and routing phase of device design.

SUMMARY

Some or all of the aforementioned needs, and other needs, may be satisfied by several aspects of the present invention.

It is now disclosed for the first time a method of computing a layout structure, the method comprising the steps of (a) providing a netlist of an electronic circuit; and (b) computing from said netlist a layout structure of an integrated circuit in accordance with at least one of (i.e. any combination of the following): (i) a relationship between a local current parameter (for example, a current parameter at one or more locations) within a conductor and a length of the conductor; (ii) in an array of current-bearing microstructures having a plurality of microstructures, each said current-bearing microstructures selected from the group consisting of a via and a contact, a relationship between a current parameter of a said microstructure and a cardinality of said plurality; (iii) a shape of a local time-dependent signal within said integrated circuit; (iv) a local time derivative of a voltage; (v) a local pulse energy; (vi) an induced stress of one or more structures of said integrated circuit; (vii) a function indicative of fatigue imposed on one or more structures within said integrated circuits due to switching effects; (viii) a local electrical surge parameter; (ix) a local electrical signal interference pattern; (x) a relativistic electro-migration parameter (for example, computed by effecting a relativistic computation and/or correction, of velocity); and (xi) a parameter indicative of quiescent current (for example, a local quiescence current).

In some embodiments, said layout structure is computed in accordance with a relationship between one of current through and a current density at one or more locations in said conductor and one of a maximum permissible current and a maximum permissible current density at said one or more locations, and one of said maximum permissible current and said maximum permissible current density depends at least in part on said length of said conductor.

In some embodiments, at least one of said maximum permissible current and said maximum permissible current density decreases as said length of said conductor increases.

In some embodiments, said conductor is a strip conductor having a plurality of strip regions that are each substantially parallel to each other, and said length is a strip length of said strip conductor.

In some embodiments, a total volume of said strip regions is a majority of a volume of said strip conductor.

In some embodiments, a total volume of said strip regions is at least 70% of a volume of said strip conductor.

In some embodiments, said layout structure is computed in accordance with a relationship between a current through a said current-bearing microstructure and a maximum-permissible current through said current-bearing microstructure, and said maximum permissible current density depends at least in part on said cardinality.

In some embodiments, at least one of said maximum permissible current and said maximum permissible current density decreases as said cardinality increases.

In some embodiments, said function of said local time-derivative is indicative of a slew rate at one or more locations.

In some embodiments, said netlist is provided in a hardware description language (including but not limited to VHDL and Verilog).

In some embodiments, the netlist is a gate-level description of the electronic circuit, for example, a truth-table description of the electronic circuit.

In some embodiments, said electronic circuit includes any combination of components selected from the group consisting of digital components, analog components, RF components, and optical components.

It is now disclosed for the first time a method of computing a layout structure comprising: a) providing a netlist of an electronic circuit; (b) computing from said netlist a layout structure of an integrated circuit, wherein said computing includes effecting at least one shape computation selected from the group consisting (i.e. any combination of) of: (i) a computing of a shape of an intersection region between two substantially perpendicular elongated conductors; ii) computing a non-rectangular shape of at least one of current-bearing structure selected from the group consisting of a via and a contact; and iii) computing a non-rectangular shape of a non-rectangular transition region between substantially parallel elongated conductors embedded in a semi-conductor substrate.

In some embodiments, said computing includes computing an angle between two oblique lines differentiating a border between a said conductor and a semi-conductor substrate in said intersection region.

In some embodiments, a computed angle between said oblique lines is at most 15 degrees.

In some embodiments, said computing includes computing oblique angles between two oblique lines differentiating a border between a said conductor and a semi-conductor substrate in said transition region.

In some embodiments, computing includes a parameter indicative of a curvature of a portion of said transition region.

In some embodiments, said computing of said shape of said current-bearing structure includes computing a number of sides of said current-bearing structure.

In some embodiments, said shape computation is effected in accordance with a relativistic electromigration parameter (for example, computed by effecting a relativistic computation and/or correction of velocity)

It is now disclosed for the first time a method of computing a scoring parameter indicative of at least one of a yield and a mean time between failures of an integrated circuit, the method comprising: (a) providing a description of a physical structure of said integrated circuit; (b) computing the scoring parameter from said description of said integrated circuit in accordance with at least one of (i) a relationship between a local current parameter in a conductor and a length of the conductor; (ii) in an array of current-bearing microstructures having a plurality of microstructures, each said current-bearing microstructures selected from the group consisting of a via and a contact, a relationship between a current parameter of a said microstructure and a cardinality of said plurality; (iii) a shape of a local time-dependent signal in said integrated circuit; (iv) a local time derivative of a voltage; (v) a local pulse energy; vi) an induced stress of one or more structures of said integrated circuit; vii) a function indicative of fatigue imposed on one or more structures within said integrated circuits due to switching effects; viii) a local electrical surge parameter; ix) a local electrical signal interference pattern; x) a relativistic electro-migration parameter; and xi) a parameter indicative of quiescent current (for example, a local quiescence current).

It is now disclosed for the first time a method of effecting placement and routing of an integrated circuit, the method comprising: a) generating a plurality of candidate placement-and routing-solutions; b) for each said candidate placement-and routing-solution, computing a respective scoring parameter indicative of at least one of a respective yield and a respective mean time between failures associated with said each candidate placement-and-routing-solution; and c) determining a preferred placement-and-routing from said candidate placement-and-routing-solutions and said score parameter.

In some embodiments, said determining includes rejecting structures with inferior said scoring parameters.

In some embodiments, said computing of said scoring parameter is carried out using any presently-disclosed technique.

It is now disclosed for the first time apparatus operative to compute a layout structure, the apparatus comprising: a) a memory configured to store a netlist of an electronic circuit; and b) a data processing unit configured to compute from said netlist a layout structure of an integrated circuit in accordance with at least one of (i) a relationship between a local current parameter in a conductor and a length of the conductor; ii) in an array of current-bearing microstructures having a plurality of microstructures, each said current-bearing microstructures selected from the group consisting of a via and a contact, a relationship between a current parameter of a said microstructure and a cardinality of said plurality; iii) a shape of a local time-dependent signal in said integrated circuit; iv) a local time derivative of a voltage; v) a local pulse energy; vi) an induced stress of one or more structures of said integrated circuit; vii) a function indicative of fatigue imposed on one or more structures within said integrated circuits due to switching effects; viii) a local electrical surge parameter; ix) a local electrical signal interference pattern; x) a relativistic electro-migration parameter; and xi) a parameter indicative of quiescent current.

It is now disclosed for the first time apparatus operative to compute a scoring parameter indicative of at least one of a yield and a mean time between failures of an integrated circuit, the apparatus comprising: a) a memory adapted to store description of a physical structure of said integrated circuit; b) a data processing unit adapted to compute the scoring parameter from said description of said integrated circuit in accordance with at least one of: i) a relationship between a local current parameter in a conductor and a length of the conductor; ii) in an array of current-bearing microstructures having a plurality of microstructures, each said current-bearing microstructures selected from the group consisting of a via and a contact, a relationship between a current parameter of a said microstructure and a cardinality of said plurality; iii) a shape of a local time-dependent signal in said integrated circuit; iv) a local time derivative of a voltage; v) a local pulse energy; vi) an induced stress of one or more structures of said integrated circuit; vii) a function indicative of fatigue imposed on one or more structures within said integrated circuits due to switching effects; viii) a local electrical surge parameter; ix) a local electrical signal interference pattern; x) a relativistic electro-migration parameter; and xi) a parameter indicative of quiescent current.

It is now disclosed for the first time apparatus operative to effect placement and routing of an integrated circuit, the apparatus comprising: a) a data processing unit adapted to: i) generate a plurality of candidate placement-and routing-solutions; ii) for each said candidate placement-and routing-solution, compute a respective scoring parameter indicative of at least one of a respective yield and a respective mean time between failures associated with said each candidate placement-and-routing-solution; and iii) determine a preferred placement-and-routing from said candidate placement-and-routing-solutions and said failure score parameter.

According to some embodiments, the apparatus further comprises a hardware specification language engine for specifying a netlist of an electronic circuit.

According to some embodiments, said hardware specification engine includes a compilation engine for compiling hardware description language.

These and further embodiments will be apparent from the detailed description and examples that follow.

DETAILED DESCRIPTION

Introduction

Figure 1:
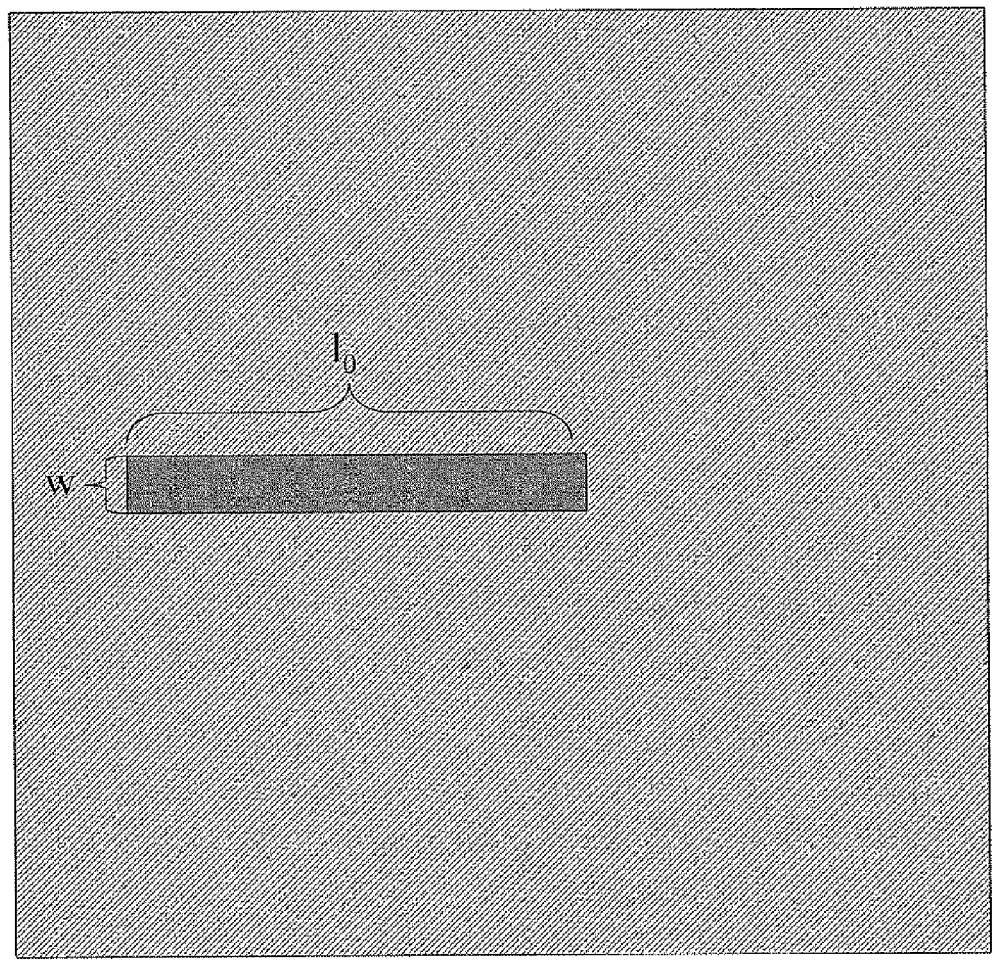
FIGS. 1, 2A, 2B and 2C illustrate typical elongated conductors embedded in a semi-conductor substrate.

The present invention will now be described in terms of specific, example embodiments. It is to be understood that the invention is not limited to the example embodiments disclosed. It should also be understood that not every feature of the presently disclosed method, apparatus and computer-readable code for maintaining computing parameters of an integrated circuit and/or for integrated circuit design is necessary to implement the invention as claimed in any particular one of the appended claims. Various elements and features of devices are described to fully enable the invention. It should also be understood that throughout this disclosure, where a process or method is shown or described, the steps of the method may be performed in any order or simultaneously, unless it is clear from the context that one step depends on another being performed first.

The present inventor has conducted experiments and has effected simulations to characterize the relationship between various physical parameters of integrated circuits and the likelihood of electronic device failure. The present inventor is now disclosing for the first time that certain physical phenomena have a surprising impact on the predicted of device failure, and thus are surprisingly relevant to integrated circuit design. In accordance with the results of the aforementioned experiments and simulations, the present inventor is now disclosing for the first time certain design principles which are useful for design of physical structures of integrated circuits, and in particular, in useful for automated placement and routing of integrated circuit components among other design processes.

It is noted that the teachings of the present invention relate to physical design of any integrated circuits having any combination of digital components, analog components, RF components, and optical components. The teachings of the present invention relate to various circuits, including but not limited to CMOS, NMOS, PMOS, JFET, and BIPOLAR.

The teachings of the present invention relate to design and/or analysis of any integrated circuit, including but not limited to memory chips (for example, flash memory, RAM, ROM), FPGA, digital circuits, analogue circuits, gate arrays, gate arrays, arrays, doublers, dividers, filters, comparators, microprocessors, regulators, PLLs, power amplifiers, D to A, A to D, differential amplifiers, operational amplifiers, etc.

In some embodiments, the present invention provides methods, apparatus, and computer-readable code for physical design of integrated circuits that are less likely to fail (or to have a greater mean time between failures). It is appreciated that by designing structures with a decreased likelihood of device failure, it is possible to increase yield during device manufacture.

During the course of the aforementioned experimental and computational investigations, the present inventor has observed that in certain scenarios, any combination of the following principles may prevail:

A) Electromigration Effects: The Maximum Permissible Current Density in a Electrical Connector May Depend on the Length of the Conductor It is generally understood that it is useful to impose a maximum current constraint for connectors (i.e. elongated conductors) embedded in a substrate. Thus according to this principle, it is preferred that the maximum allowable current (e.g. a peak current, a root mean current, or any other parameter indicative of current amplitude) at various locations in the circuit remain below a given threshold in order to decrease the likelihood of device failure (and/or alternatively, to increase a parameter indicative of a mean time between failures). Previously, it has been believed that the maximum allowable current through a connector is independent of the length of the connector.

The present inventor is now disclosing for the first time that it is useful to apply a design principle where the maximum allowed current through the connector and/or through any given location of the connector varies in accordance with a connector length. In particular, the present inventor is now disclosing a design principle where for longer connectors, it is useful to require a lower maximum allowable current—i.e. the maximum allowable current decreases for connectors of increasing length.

Figure 2A:
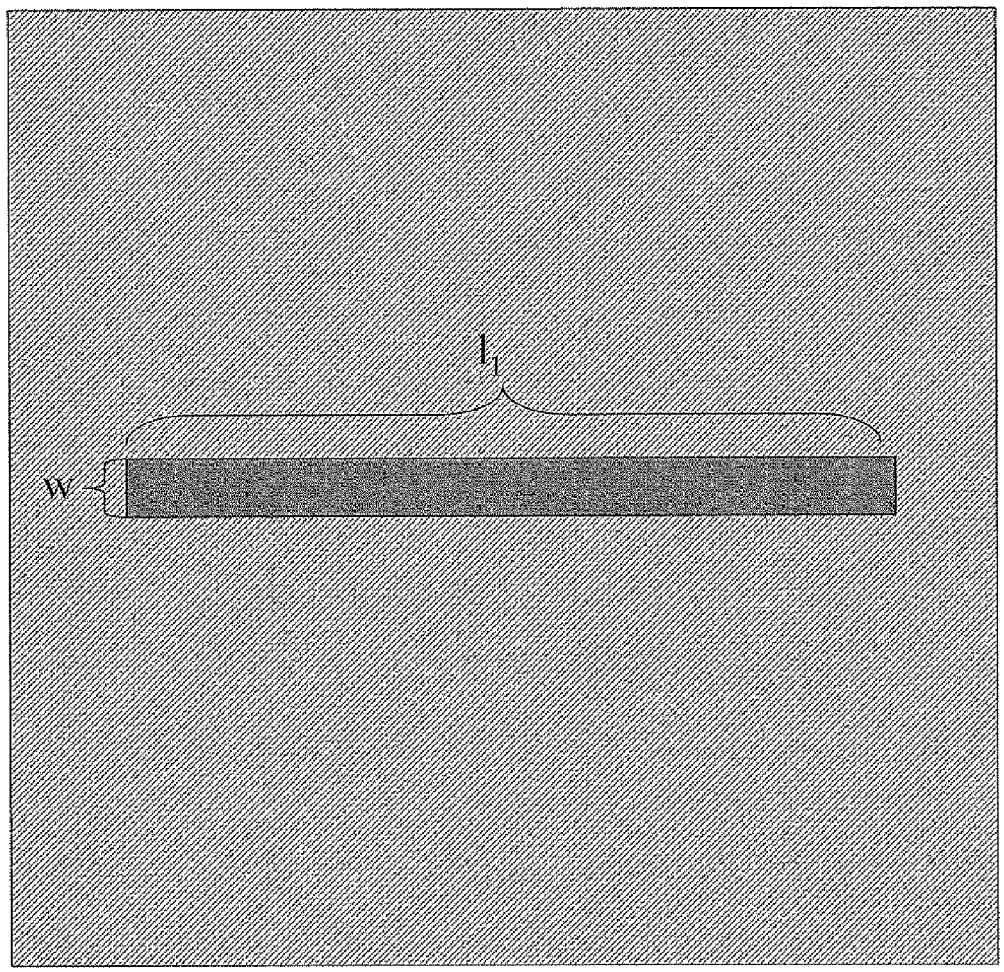

The definition of "connector" length to be used is that typically used in integrated circuit design. FIG. 1 illustrates a typical elongated connector (a conducting material, for example, a metal, for example, an alloy) embedded in a substrate (for example, a semiconductor or doped semiconductor) having a width w (typically on the order of maximum of less than one micron) and a length $l_0$ (typically on the order of magnitude of at least one millimeter) FIG. 2A illustrates a different elongated connector having a different length $l_1$. Thus, according to some teachings of the present invention, a design constraint is imposed such that the maximum allowable current in the connector of FIG. 2A is less than that allowable in the connector of FIG. 1.

It is noted that FIG. 2A is not drawn to scale, and typically the length $l_1$ is on the order of magnitude of at least one millimeter, or at least one centimeter, while the width w is typically at most a few microns, and often a sub-micron distance.

It is understood the particular shapes of the microstructures of FIGS. 1-2, as with all illustrated microstructures disclosed herein, are provided as illustrative and not as limiting.

As will be discussed below, it is appreciated that the present design principle (as well as other presently-disclosed design principles) need not be applied "rigidly"—i.e. in certain embodiments, a structure where the current exceeds the maximum current may be allowed but penalized in some manner. Thus, although the aforementioned principle has been explained as a "constraint," this teaching may be expressed for example, when computing a cost and/or yield and/or function indicative of a likelihood of failure and/or mean time between failures of a given integrated circuit (for example, designed from a given layout scheme or putative layout scheme).

Figure 2B:
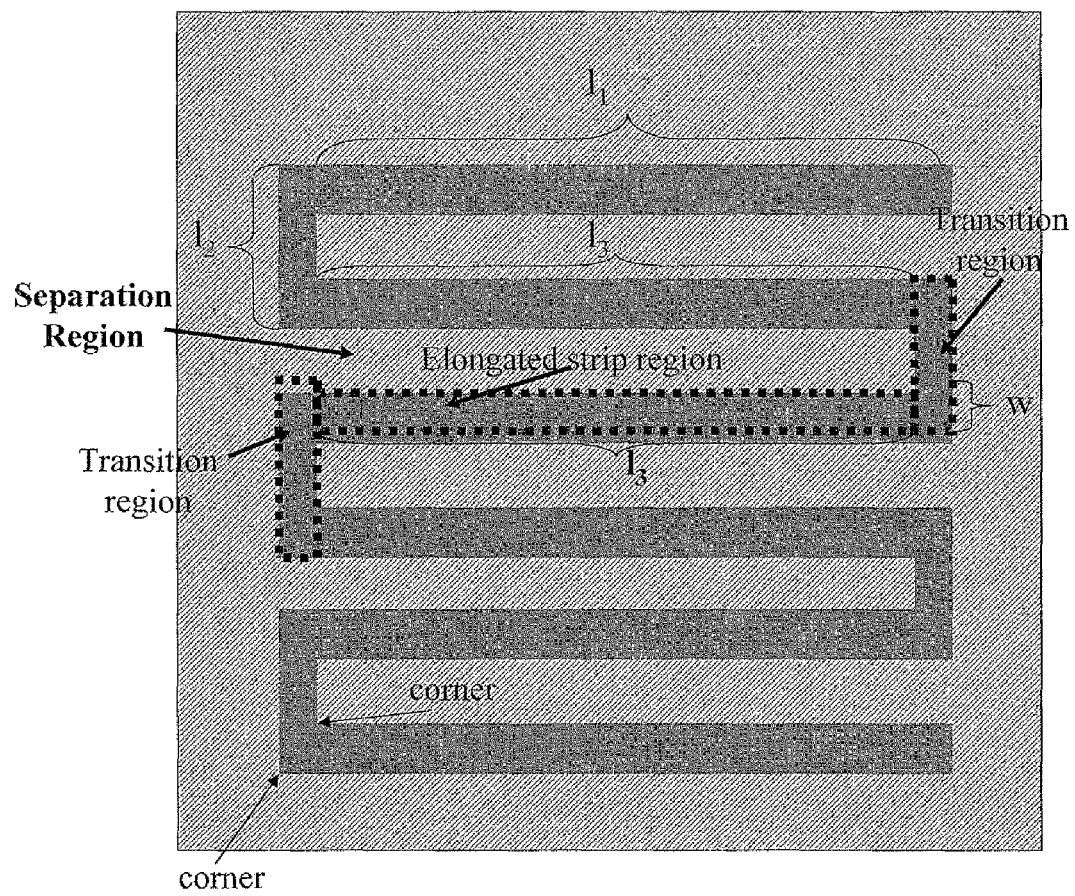

It is noted that the conductor structure in FIG. 2B may be defined as a "strip conductor" which is defined to comprise at least one elongated portion or "strip." Each "strip" is defined such that a longest dimension of minimally circumscribing rectangular prism is at least a certain ratio (for example, at least 10 times) a next longest dimension of a minimally circumscribing rectangular prism. In some embodiments, the ratio is at least 100, or at least 1000 (for example, in cases where the thickness of the conducting strip is at most a few microns, and the length of the conducting strip is at least a few millimeters).

For the case where a single "strip conductor" comprises a plurality of different strips, each strip is substantially parallel to each other (for example, within a tolerance of at most 15 degrees), and the strips are separated from each other by "separation region." In most embodiments, when flowing a current through the "strip conductor," a majority of the current (typically substantially all of the current, for example, at least 90% of the current) that flows from one conducting strip to another conducting strip, flows through the "transition region."

In some embodiments, the "elongated strip regions" comprise a majority of a volume of the "strip conductor." In some embodiments, this majority is a substantially majority (for example, at least 70%, or at least 90%).

Figure 2C:
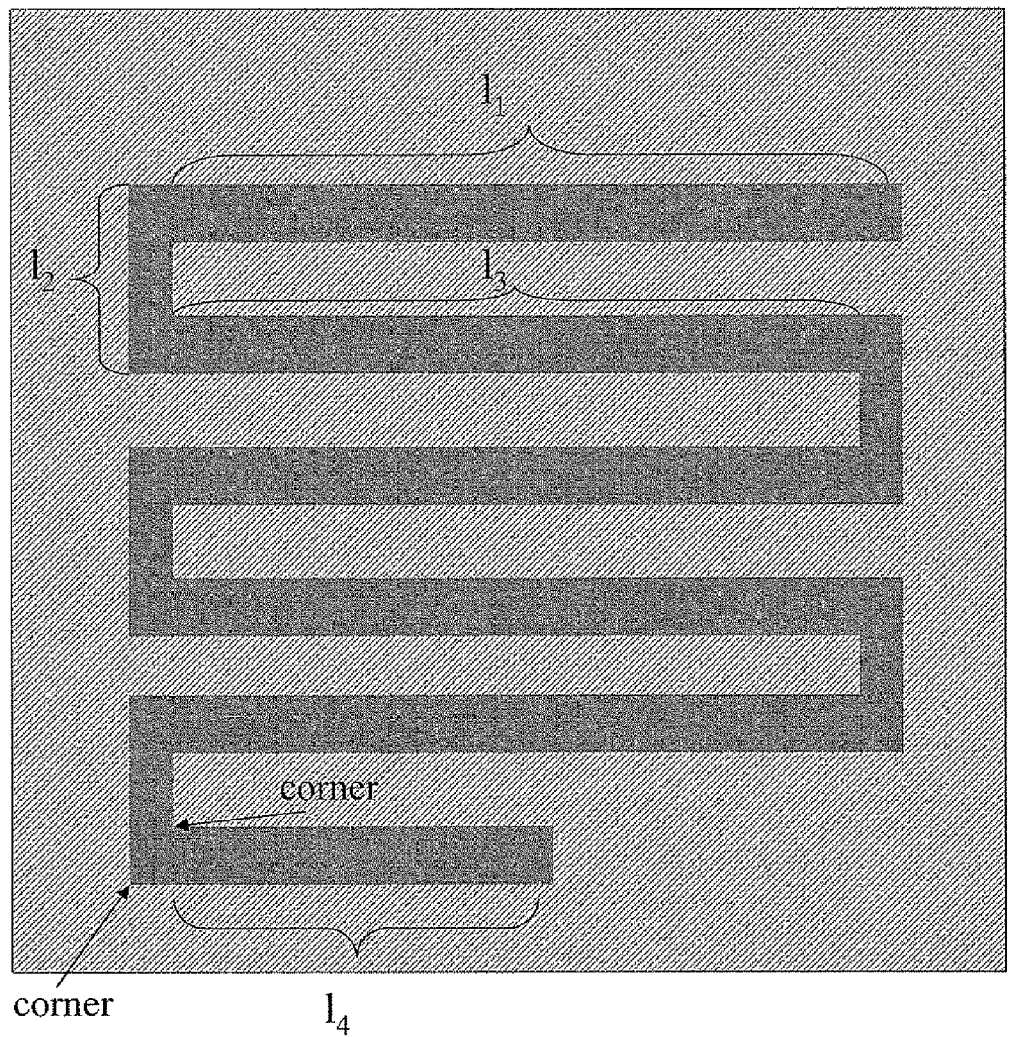

In FIGS. 2B-2C, each transition region is rectangular, though as will be explained below, other shapes are certainly contemplated by the present inventor.

The "conducting" region is a higher conductivity than the surrounding semi-conductor matrix, and may be composed of metals (pure metals or alloys) or a doped semiconductor, such as polysilicon, or any other conducting substance.

As used herein, the "minimally circumscribing" rectangular prism refers to the circumscribing rectangular prim with the minimal volume.

It is noted that one may define an "effective strip length" for a given "strip conductor," which is defined as the sum of the lengths of each constitutive strip. Thus, for the example of FIG. 2B, the strip length is $4l_3+2l_1$. For the example of FIG. 2C, the strip length is $4l_3+1l_4+l_1$. Although the aforementioned principle has been explained in terms of current and current density, in some embodiments, any function of the maximum permissible current may depend on some sort of length metric of the connector (for example, the effective strip length).

Not wishing to be bound by theory, the present inventor is disclosing (see discussion on "local slew rate" below) that a given microstructure of an integrated circuit (for example, a via and/or contact and/or conductor/connector) may, due to being subjected to electrical current over a period of time (for example, of weeks, months or years) begin to develop microscopic defects and/or fractures and/or precursors to fractures, for example, due to collisions with between flowing charge and a lattice structure of the conductor (for example, metal such as an alloy). Thus, in longer conductors there is more "opportunity" for such potentially damaging micro-events occur.

As such the inventor is disclosing for the first time that it is useful to incorporate such effects (i.e. that current flowing through a longer conductor may be more damaging to the conductor within the integrated circuit over time) when effecting design calculations (for example, imposing a design constraint and/or "scoring" a function indicative of failure probability and/or mean time between failures and/or selecting and/or deriving a layout structure of the integrated circuit).

During the course of the present inventor's research, the present inventor has found that the following non-limiting illustrative table describing the maximum current density as a function of "length" of a given conductor/connector may be useful.

TABLE 1

| Maximum Permissible Current Density | | |
| --- | --- | --- |
| Number of Equivalent Structures | cm | Maximum j A/sq. cm |
| 1 | 0.8 | 6.50E+05 |
| 10 | 8 | 5.70E+05 |
| 100 | 80 | 5.10E+05 |
| 1,000 | 800 | 4.60E+05 |

TABLE 1-continued

| Maximum Permissible Current Density | | |
| --- | --- | --- |
| Number of Equivalent Structures | cm | Maximum j A/sq. cm |
| 10,000 | 8,000 | 4.20E+05 |
| 100,000 | 80,000 | 3.80E+05 |

Figure 3A:
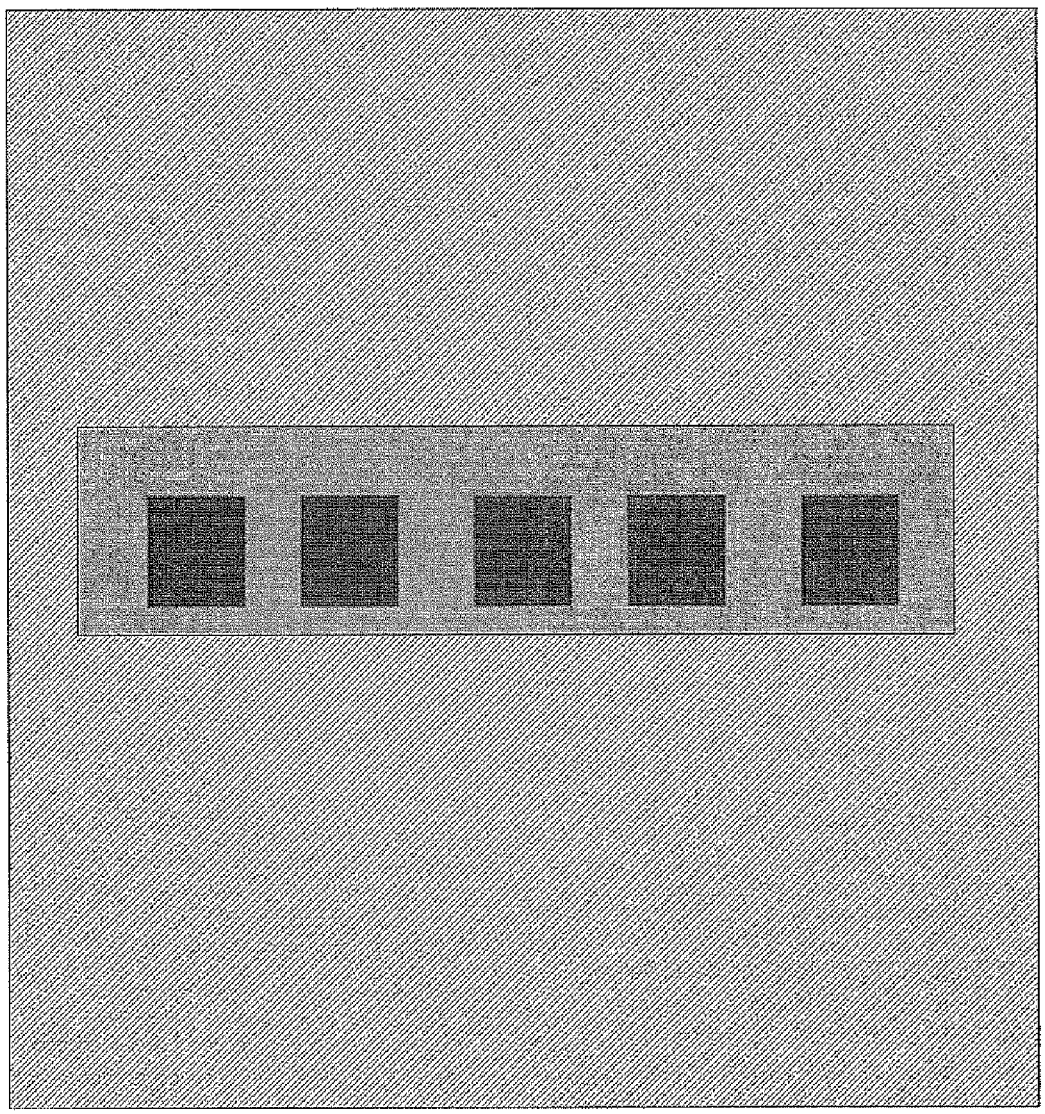
FIGS. 3A-3B illustrated exemplary arrays of current-bearing microstructure (for example, vias or contacts) in accordance with exemplary embodiments of the present invention.
Figure 3B:
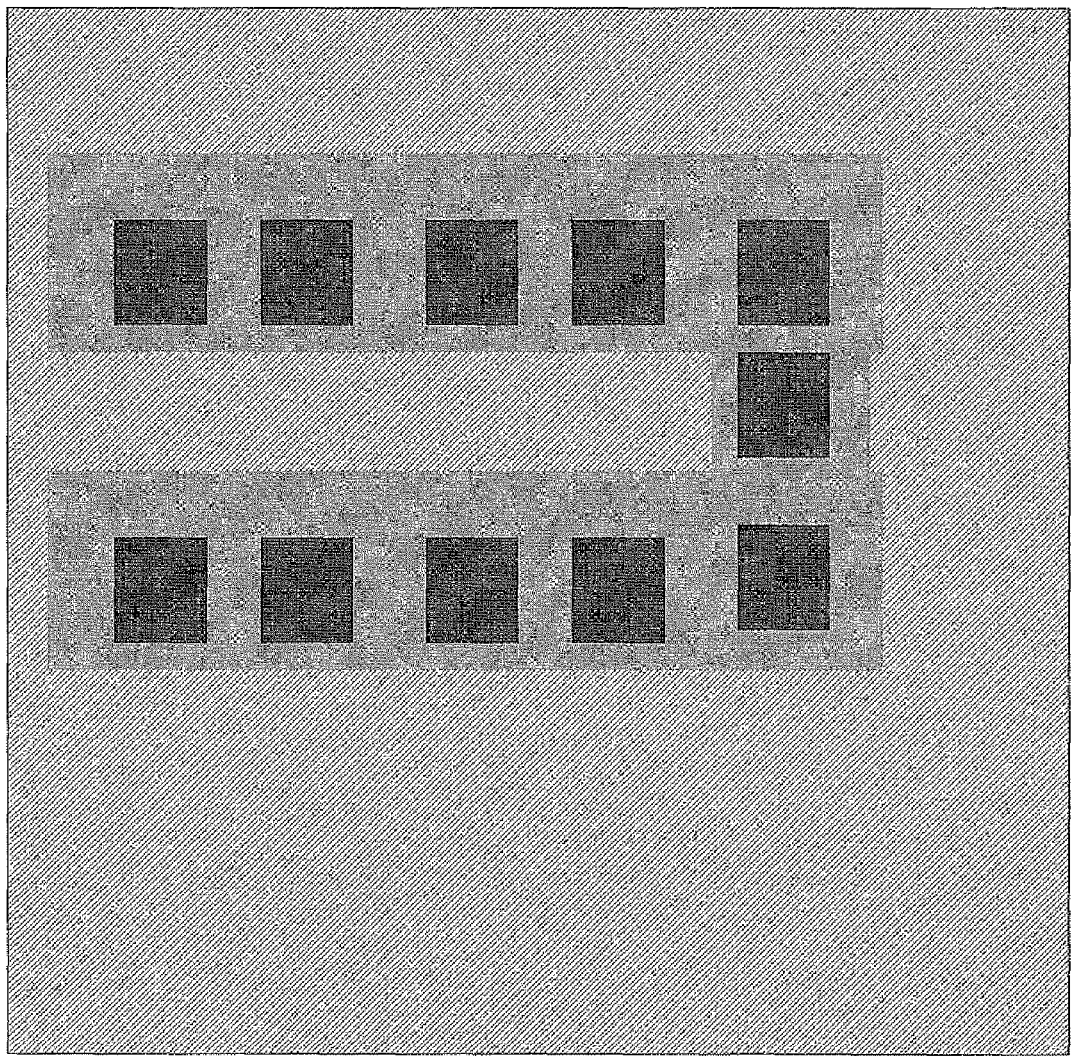

B) Electromigration Effects: The Maximum Permissible Current Density in a Via and/or Contact May Depend on the Length of the Conductor FIG. 3A depicts an exemplary structure having 5 vias and/or contacts (depicted as black squares) within a single array of current bearing microstructres (i.e. vias or contacts). FIG. 3B depicts an exemplary structure having 11 vias and/or contacts (depicted as black squares) within a single array of current bearing microstructures (i.e. vias or contacts).

It is generally understood that it is useful to impose a maximum current constraint on the amount of current (i.e. a maximum current constraint) that may flow through each of the vias and/or contacts. Previously, it has been believed that this maximum current is independent of the number of vias and/or contacts in a given array of vias and/or contacts (i.e. that are consecutively embedded in a single structure).

The present inventor is now disclosing for the first time that it is useful to apply a design principle where the maximum allowed current through any given contact and/or via varies in accordance with a number of vias and/or connector in a given array of vias and/or connectors.

As will be discussed below, it is appreciated that the present design principle (as well as other presently-disclosed design principles) need not be applied "rigidly"—i.e. in certain embodiments, a structure where the current exceeds the maximum current may be allowed but penalized in some manner. Thus, although the aforementioned principle has been explained as a "constraint," this teaching may be expressed for example, when computing a cost and/or yield and/or function indicative of a likelihood of failure and/or mean time between failures of a given integrated circuit (for example, designed from a given layout scheme or putative layout scheme).

Not wishing to be bound by theory, the present inventor is disclosing (see discussion on "local slew rate" below) that a given microstructure of an integrated circuit (for example, a via and/or contact and/or conductor/connector) may, due to being subjected to electrical current over a period of time (for example, of weeks, months or years) begin to develop microscopic defects and/or fractures and/or precursors to fractures, for example, due to collisions with between flowing charge and a lattice structure of the conductor (for example, metal such as an alloy). Thus, in longer array of vias and/or contacts there is more "opportunity" for such potentially damaging micro-events occur.

As such the inventor is disclosing for the first time that it is useful to incorporate such effects (i.e. that current flowing through a vias that are part of a larger array of vias and/or contacts may be more damaging to the conductor within the integrated circuit over time) when effecting design calculations (for example, imposing a design constraint and/or "scoring" a function indicative of failure probability and/or mean time between failures and/or selecting and/or deriving a layout structure of the integrated circuit).

During the course of the present inventor's research, the present inventor has found that the following non-limiting illustrative table describing the maximum current density as a function of a number of vias and/or connectors may be useful.

TABLE 3 maximum current for vias and contacts as a function of the total number of vias and contacts at the maximum current.

| Number of Vias At Maximum I | Maximum Current n = 1 mA | Maximum Current n = 1.3 mA |
|---|---|---|
| 1 | 3.1 | 4.6 |
| 10 | 2.5 | 4.0 |
| 100 | 2.1 | 3.5 |
| 1,000 | 1.8 | 3.1 |
| 10,000 | 1.6 | 2.8 |
| 100,000 | 1.4 | 2.5 |
| 1,000,000 | 1.2 | 2.3 |
| 10,000,000 | 1.1 | 2.1 |

Both n = 1 "growth only" (most conservative) and n = 1.3 "nucleation and growth" current exponents are presented.

C) Local Slew Rate and/or Time Derivatives of Voltage at One or More Locations in an Integrated Circuit The present inventor is now disclosing that the mean time between failures of an integrated circuit device (or any function indicative thereof) may depend on a function of time derivative of voltage (for example, a slew rate) at different locations in the integrated circuit. The localized derivatives of voltage at different locations may, in turn, depend on various geometric and/or physicochemical properties of the integrated circuit. Thus, the present inventor is disclosing that it may be advantageous to compute a function indicative of a localized time derivative of voltage (for example, when computing a function indicative of a predicted mean time between failures of a particular integrated circuit design) and/or to impose a design constraint requiring that a local pulse energy be less than a threshold (which may or may not vary within the circuit).

Figure 4:
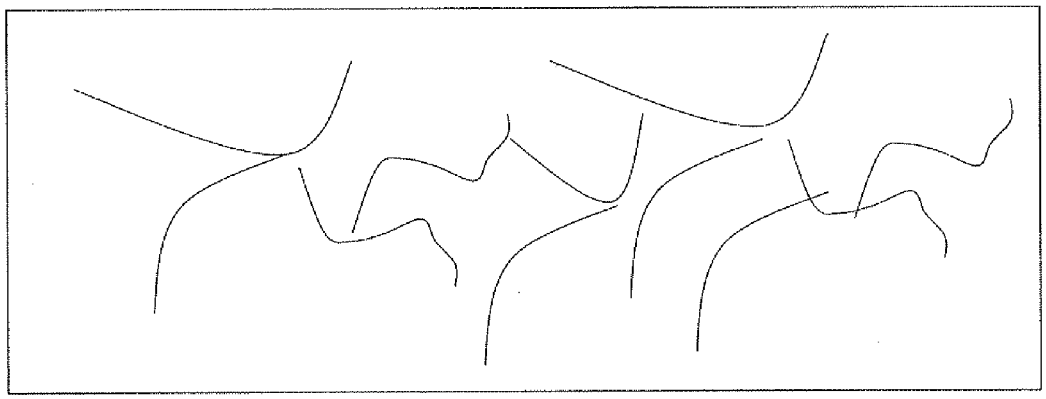
FIG. 4 illustrates a schematic of an exemplary microstructure (for example, a conductor).

Not wishing to be bound by theory, and with reference to FIG. 4, the present inventor is now disclosing that over time, a given microstructure of an integrated circuit (for example, a via and/or contact and/or conductor/connector) may, due to being subjected to electrical current over a period of time (for example, of weeks, months or years) begin to develop microscopic defects and/or fractures and/or precursors to fractures, for example, due to collisions with between flowing charge and a lattice structure of the conductor (for example, metal such as an alloy).

Still, not wishing to be bound by theory, it is noted that the damage sustained by a microscopic conductor for any given current and/or current profile may dependent on physicochemical properties of the conductor (for example, the makeup of the alloy) and/or on the temperature of the conductor. Typically, micro-events which are pre-cursor to micro-fracture may be associated with a given activation energy—for example, for metals or alloys of higher "quality" or that are more inert, this activation energy may be greater. Thus, it is noted that typically, the damage sustained by a given stretch of conductor during current flow may be greater at lower temperatures.

The present inventor is disclosing that, in some embodiments, the mean time between failures may be expressed by the following non-limiting equations:

$$MTF = t_{50} = A \cdot J^n \cdot (SL)^{-m} \exp\left[\frac{Ea}{kT}\right]$$

where A is some sort of correction factor, J is the local current at a given point, SL is the slew rate of the forcing signal at a given location, Ea is an activation energy for an event damaging to the conductor, k is Boltzmann's coefficient, and n and m are non-negative numbers. Equation (1) may be used, for example, incorporated into a yield and/or failure likelihood function for a given physical circuit and/or layout scheme and/or putative layout scheme.

Once again, not wishing to be bound by theory, the present inventor is disclosing that greater rises or drops in voltage may increase the rate at which damage is sustained by the conductor, thereby reducing the amount of time between failure—this is expressed by the fact that m is a non-negative number.

Thus, the present inventor is disclosing that it may be advantageous to design the structure of an integrated circuit in accordance with a likelihood of local failure that is derived from functions of time derivatives in voltages and/or the signal profile and the geometry and/or physiochemical properties of the integrated circuit.

Although the aforementioned principle has been expressed in terms of a technique for calculating a function indicative of cost and/or yield and/or failure likelihood and/or predicted time between failures, it is appreciated that this principle may also be expressed as a design constraint. Thus, in one example, a given layout structure is rejected if a slew rate and/or any other parameter indicative of a time derivative (first derivative or higher-order derivative) of an EMF in a given location or set of locations exceeds a given value. Thus, in one example, a maximum "slew rate" (or maximum for any function of time derivatives of the voltage) may be imposed upon different locations in an integrated circuit, and a given integrated circuit may be rejected if a local slew rate exceeds the maximum.

D) Localized Pulse Energy

The present inventor is now disclosing that the mean time between failures of an integrated circuit device (or any function indicative thereof) may depend on a function of localized pulse energy (i.e. in systems driven by a pulse-shaped driving signal, the localized pulse energy is the energy per pulse that a given location is subjected to) at different locations in the integrated circuit. The localized pulse energy at different locations may, in turn, depend on various geometric and/or physiochemical properties of the integrated circuit. Thus, the present inventor is disclosing that it may be advantageous to compute a function indicative of a localized pulse energy (for example, when computing a function indicative of a predicted mean time between failures of a particular integrated circuit design) and/or to impose a design constraint requiring that a local pulse energy be less than a threshold (which may or may not vary within the circuit).

Not wishing to be bound by theory, it is noted that in integrated circuits that are driven by a pulsed driving voltage, different locations in the integrated circuit may be associated with a local pulse energy associated with a given pulse.

The present inventor is disclosing that a conductor in an integrated circuit is more likely to sustain greater damages for increased local pulse energy. The local pulse energy is a function of the pulse energy of the signal imposed on the circuit, and the geometry and physical chemical properties of the circuit. Thus, it may be advantageous to select circuit layouts which reduce the local critical pulse energy. This teaching may be implemented as a design rule (i.e. computing a localized pulse energy for a given circuit layout, and rejecting the layout if the localized pulse energy exceeds a maximum, where the maximum also depend on the geometry of the circuit). Alternatively or additionally, this teaching may be implemented when computing a function indicative of yield and/or failure likelihood and/or predicted time between failures.

Any known formula indicative of maximum allowable pulse energy is within the scope of the present invention. In some embodiments, the present inventor has found the following formula for calculating maximum allowable pulse energy may be useful:

$$E_{crit}=[m_ic_i+m_jc_j+m_kc_k]Y_{crit}(TCR)^{-1}+m_iL_{fi}$$

Here, m is mass density, c is specific heat, $Y_{crit}$ is a factor, TCR is the temperature coefficient of resistance, and $L_{fi}$ is the latent heat of fusion of aluminum. Subscripts i, j, and k are to identify component metals of an alloy, for example, AlCu, TiN, and oxide sheath, respectively.

It is appreciated that modifications may be made to the aforementioned formulae, which are illustrating and not limiting.

E) Induced Stress:

The present inventor is now disclosing that the mean time between failures of an integrated circuit device (or any function indicative thereof) may depend on a function of mechanical stress of certain geometric structures within the integrated circuit that are induced by current flow through the integrated circuit. Thus, the present inventor is disclosing that it may be advantageous to compute a function indicative of induced stress (for example, when computing a function indicative of a predicted mean time between failures of a particular integrated circuit design) and/or to impose a design constraint requiring that an induced stress be less than a threshold (which may or may not vary within the circuit).

Not wishing to be bound by theory, it is noted just as mechanical stress and/or strain is derived from both an imposed load as well as the geometry of a certain structure, so too stress and/or strain (i.e. mechanical) on various locations of the circuit may be derived from the geometry of the microstructures of the integrated circuits. Thus, it is possible, during design, to design a more robust integrated circuit (i.e. an integrated circuit more likely to operate for a greater time without failures or with fewer failures) by judiciously selecting the geometry of various regions of the integrated circuit.

Thus, in some embodiments, a certain failure and/or cost and/or yield function is computer in accordance with an indication of induced stress and/or strain (i.e. mechanical) imposed on the circuit or a portion thereof (for example, a transistor structure, a transition region, and an intersection region) during operation. This teaching may also manifest itself by rejecting certain circuit layouts if a computed strain and/or stress (for a certain region of the integrated circuit) exceed a pre-determined minimum.

F) Switch On and Off Effects:

It is noted that when a user switches on or a device (thereby changing an electrical driving signal imposed on the device), there may be some latency between a time that the external "driving signal" is changed by switch on/off, and the time "information" (in the form of a modified electrical signal and/or current) propagates to various locations within the integrated circuits. As the electrical signal ("information") propagates to a given location, there may be "interference patterns" between a condition which previously prevailed (i.e. indicative of an electrical signal before the switch on/switch off), and the new electrical signal derived from switch on/switch off events. These interference patterns may contribute to fatigue of the materials within the integrated circuits.

The present inventor is disclosing for the first time that it is surprisingly useful in general to consider factors derived from these switch on/switch off effects of an integrated circuit during integrated circuit design. In particular, a) locations "closer" to a location of driving signals (I.e. measured in signal propagation distance—for example, closer to $V_{DD}$ and/or $V_{SS}$ substantial equipotential which imposes the driving signal) may experience a greater "surge effect" than locations that is are "farther" from the source of a switch on/switch off event (I.e. the source of the imposed driving signal). As such, these "closer locations" may be subjected to more fatigue, and it may be judicious during the design process to prefer integrated structures providing greater mechanical stability in one or more regions closer to driving signal source.

b) locations "further" from a location of driving signals may experience more damage due to signal interference between "signal fronts" or "wave fonts" generated by the switch on and/or switch off effects.

In some embodiments, the two aforementioned phenomena may opposed each other and/or reinforce each other, dependent on the specific physics of a given integrated circuit.

Theoretical Discussion

The present theoretical discussion is illustrative and not limiting. The closer the power supply voltage is to the threshold voltage, the greater the reduction in switching speed, since a transistor's drive capability is a function of $(V_{Gs}-V_t)$.

The propagation delay along a single path, T', at power supply voltage $V_0$-$VV_{DD}$ was related to the delay, $T_0$, at the nominal power supply voltage $V_0$ by $$T'=xT_0(1-k\nabla V_{DD}/V_0)+(1-x)T_0 \quad (6)$$

Where k is a process-dependent constant and x is the function of total path delay due to gate delays in the signal path at $V_0$.

This equation is used to predict the propagation delays of various paths, and thus the operating frequency of a circuit at a particular power supply voltage, based on the delays at a nominal voltage.

It should be noted that, according to this equation paths can change at different voltages. The above examples emphasize the importance of the right structure formation in opposing failure incubations which may lead to lower yield.

Physically we might expect that the number of events required to produce failure (n) should scale in the same way as N (the total number of available events)—although this need not be so if the failure mechanism is localized with a few events leading to a local short or open circuit. The larger failure criterion used in device, should, if anything, overestimate the value of n and so the fact that it remains the same supports our argument for no increase in the value of n with increasing L.

Also, the increase of n with W implies that the change in threshold voltage is related to microscopic events along the two long edges of the gate adjacent to source and drain. The required number of such events may well increase with W. This change should not be confused with changes due to geometry effects which influence the initial value of threshold voltage.

If $R_{in}$ is input resistance and can probably be expressed as $R\sqrt{W}$ with $R_i$ a constant, reduction in $R_L$, due to failure will cause to restore $V_A$ to the turn-on value. We can write $R_L$, as:

$$R_L = \frac{R_U}{M+n}$$

Where $R_u$ is "unit" resistance of the leakage path introduced by each failure event and n is the number of failure events within width W. The parameter M is the number of native leakage paths (present at time zero) proportional to W. We express:

$$V_{SG} = V_A \frac{(R_{in} + R_L)}{R_L}$$

where $V_A$ is fixed by the channel bias requirements.
Before any failures we have (n=o)

$$V_{SGI} = (MV_A/R_u)[(R_i/W)+(R_u/M)]$$

We define the fractional change in threshold voltage as:

$$\nabla V_{SG}/V_{SGI} = (V_{SG}-V_{SGI})V_{SGI} = (R_i n)(R_u W)$$

Clearly, when W increases, M increases and n must increase to produce the same fractional change in threshold voltage. This predicts a monotonic increase in the number of microscopic events required to produce failure (n) with the width of the device W and would explain the observed results. This explanation is offered by way of example, and other similar mechanisms may be responsible.

G) Electromigration Effects: Relativistic Effects

To date, relativistic effects (for example, when computing a function of current and/or a time derivative of voltage) are considered irrelevant to design goals of integrated circuits. The present inventor, in accordance with his theoretical, experimental and computational investigations of the probability of failure of integrated circuits is now disclosing for the first time that it is, in some embodiments, advantageous to incorporate relativistic effects when effecting an integrated circuit design computation (for example, when "scoring" and/or computing a function indicative of failure probability and/or imposing a design constraint.

It is further noted that that the incorporation of relativistic effects into integrated circuit design calculations may lead to preference of certain novel microstructures within integrated circuits (discussed in the next section).

Not wishing to be bound by theory, it is noted that due to relativistic effect, migrating electrons for a given current level (i.e. any function of current and/or current density and/or mean or peak current) may have slower velocities than predicted by a non-relativistic calculations. These slower electrons thus tend to spend a longer time when migrating in a given reason than otherwise predicted (i.e. with a non-relativistic computation which neglects relativistic effects). As such, the incidence of collisions and/or damaging microevents sustained by the metal (i.e. pure metal and/or alloy) due to current flow may be greater than otherwise anticipated, thereby increasing the need for more mechanically stable microstructures in the integrated circuit.

This may particularly be an issue near intersection and/or corners, which in any event may be more susceptible to current-induced damage. Thus, it may be advantageous to prefer integrated circuit designs that provide greater re-enforcement at these positions than otherwise thought necessary.

The following theoretical discussion of relativistic effects of electromigration is illustrative and not intended as limiting.

The drift velocities of both electrons & holes are functions of the electric filed and show saturation at high electric fields. The relationship for hole & electron drift velocities versus electric field in silicon at 300K are measured to be:

$$V_D = V_1(E/E_C)/[1+(E/E_C)^B]^{1/B}$$

Where for electrons $V_i=1.53\cdot10^9 T^{-0.87}$, $E_C=1.01 T^{1.55}$, $B=2.57\cdot10^{-2} T^{0.66}$, & at $$E > 10^5 - \frac{V}{cm} T = 300 \text{ K}$$

it means $$\approx 10^7 \frac{cm}{s} \sim 10^5 \text{ m/s}$$

In metals these velocities are higher so the relativistic effects are pronounced—mainly—"real" widths & lengths are "shorter" & "smaller" & the various mechanisms presented here thaw are magnified.

These "relativistic" effects may lead to a design decision wherein structures that are drawn "thicker" and "longer" are preferred to reduce the probability of failure during the device. In one example, by structures may be "bent" structures by 10% about, gaining higher Yields, and in some embodiments, even significantly higher yields.

H) Exemplary Microstructures

Figure 5A:
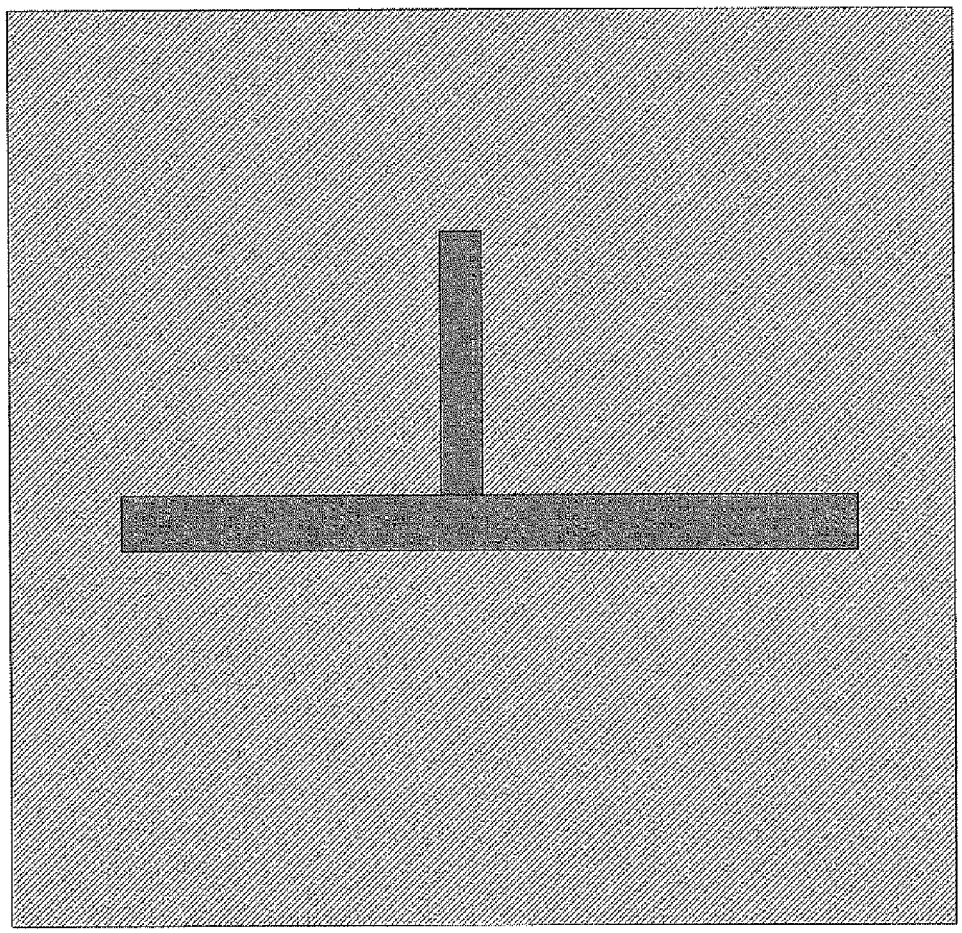
FIGS. 5A-5D provide illustrations of intersections between elongated conductors.

FIG. 5A provides an illustration of an "intersection" between two elongated conductors embedded with a semiconductor substrate (or embedded with a primary structure such as a doped semi-conductor). Such "intersection" structures are known in integrated circuits, and in some embodiments of the present invention, may be generated as part of an integrated structure layout structure. The present inventor is now disclosing that there are some scenarios where such a design may not be preferred, due to a tendency to produce an integrated circuit more likely to fail, for example, due to physical phenomena discussed herein.

Figure 5B:
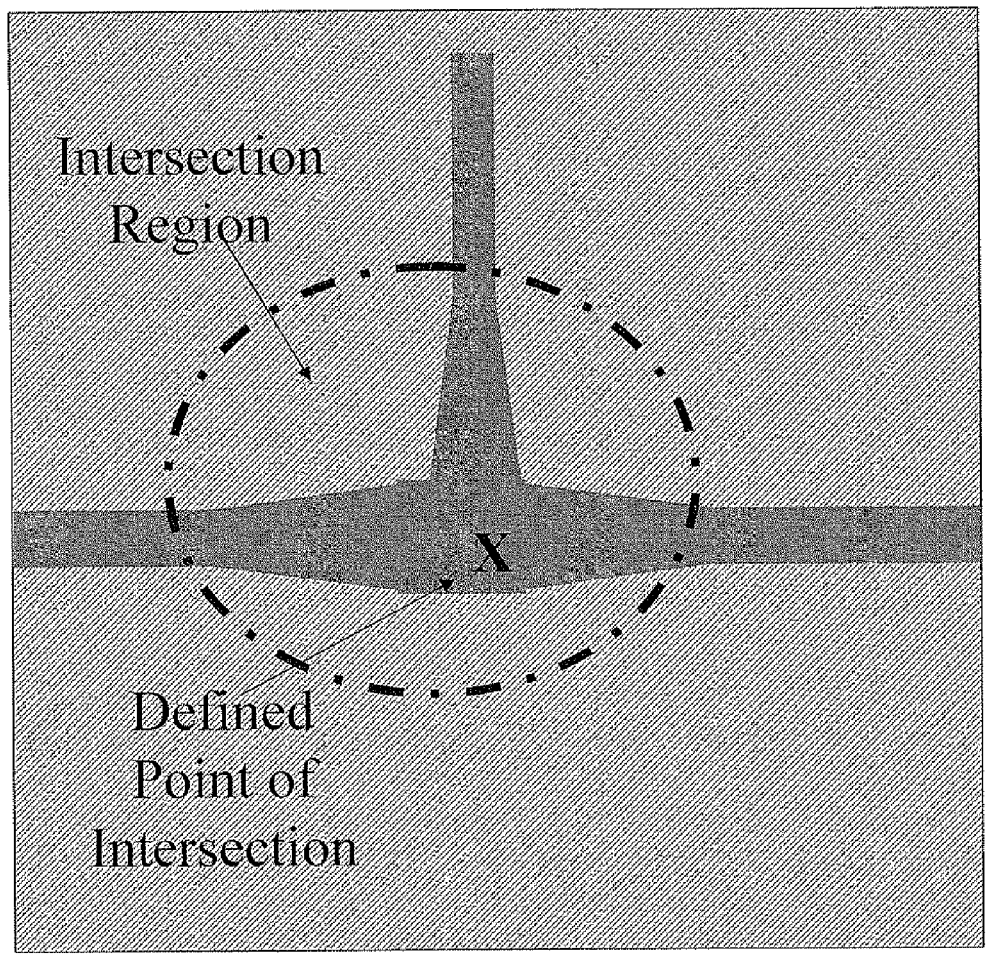

FIG. 5B provides an illustration of a novel "reinforced intersection" in accordance with some embodiments of the present invention. Thus, in some embodiments, generating a layout structure for an integrated circuit includes determining a degree of distortion and/or a widening angle for elongated conductors (i.e. electrical connection elements). Thus, certain embodiments of the present invention provide methods and/or systems and/or computer readable code for calculating an "elongated conductor intersection distortion parameter" and/or an intersection modification parameter (for example, an angle of distortion, or an area of distortion).

In some embodiments, the present invention provides methods and/or systems and/or computer readable code for calculating a shape of an intersection region (the region containing the point of intersection). The intersection region is further defined as the region within a minimally-circumscribing rectangular prism whose longest dimension is at least a factor of 10 less than a minimally-circumscribing rectangular prism of both elongated rectangular prism)

Figure 5C:
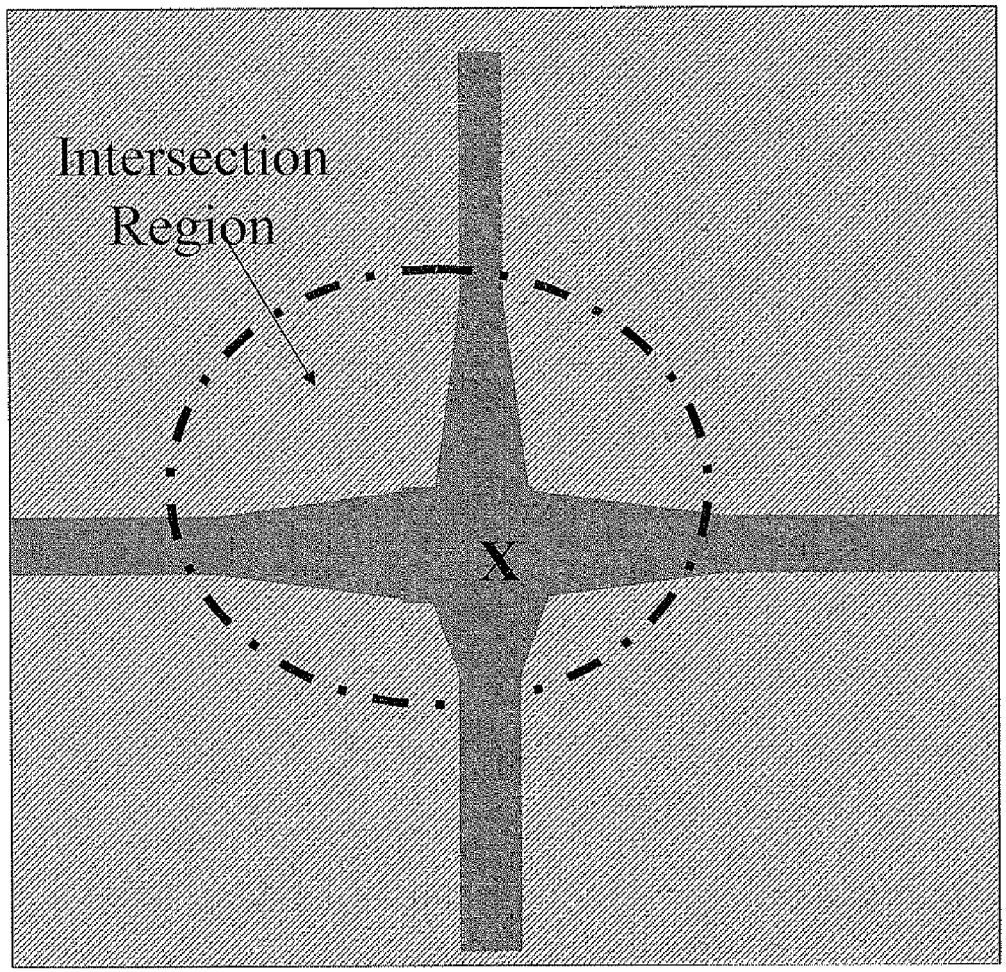

FIGS. 5A-5B show a "T" intersection. As evident form FIG. 5C, this is not a limitation of the present invention. Furthermore, in some embodiments, the elongated conductors intersect at an angle that is not exactly 90 degrees, but may deviate within some tolerance, for example, up to 15 degrees.

Figure 5D:
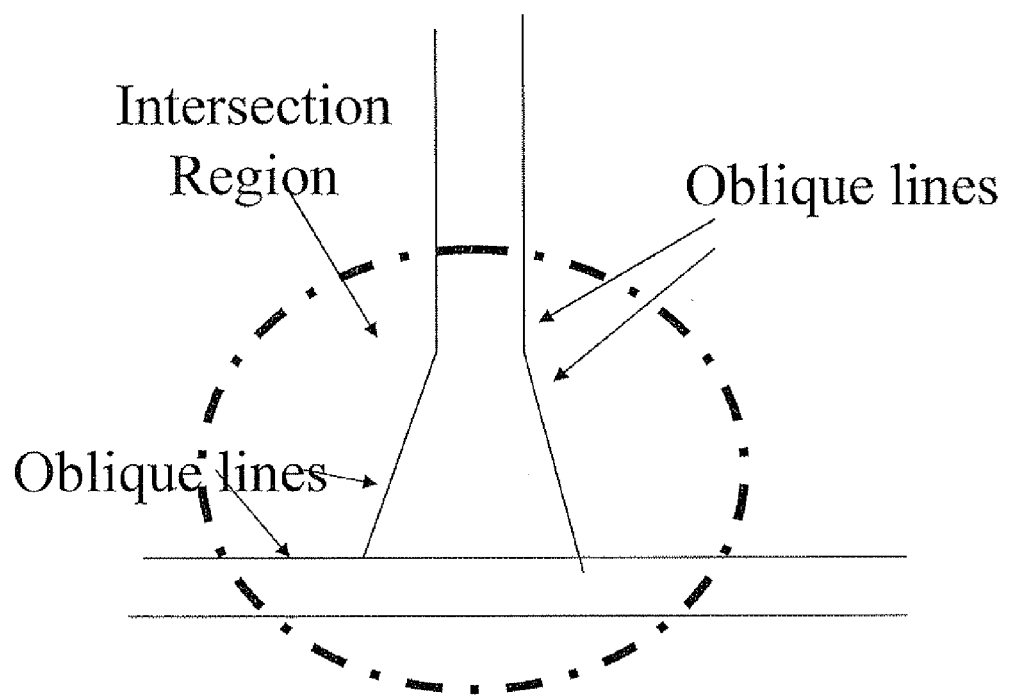

In FIG. 5D, it is evident that the borders between the conductor and the semi-conductor substrate may includes lines are oblique to each other. In some embodiments, the angle of intersection is small (for example, two border lines of one of the two conductors), for example, less than 15 degrees.

Figure 6A:
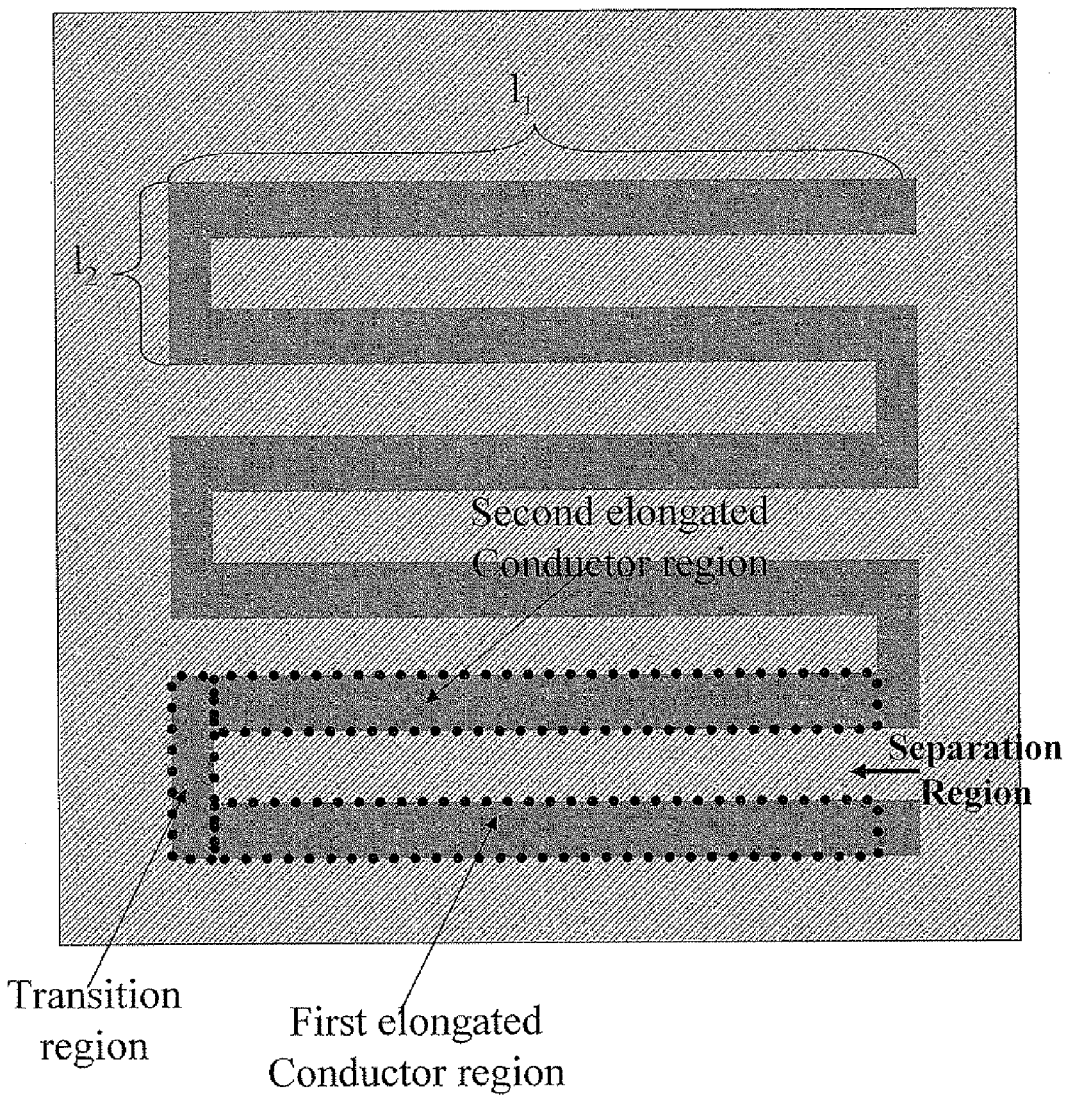
FIGS. 6A-6E provide illustrations of exemplary strip conductors and structures associated thereof in accordance with exemplary embodiments of the present invention.

FIG. 6A, provides an image of a: "strip conductor" or a "winding elongated conductor" embedded within a semiconductor substrate. The strip conductor includes a plurality of elongated strip regions and transition regions. The winding structure has "corners." The present inventor is now disclosing that there are some scenarios where such a design may not be preferred, due to a tendency to produce an integrated circuit more likely to fail, for example, due to physical phenomena discussed herein.

Figure 6B:
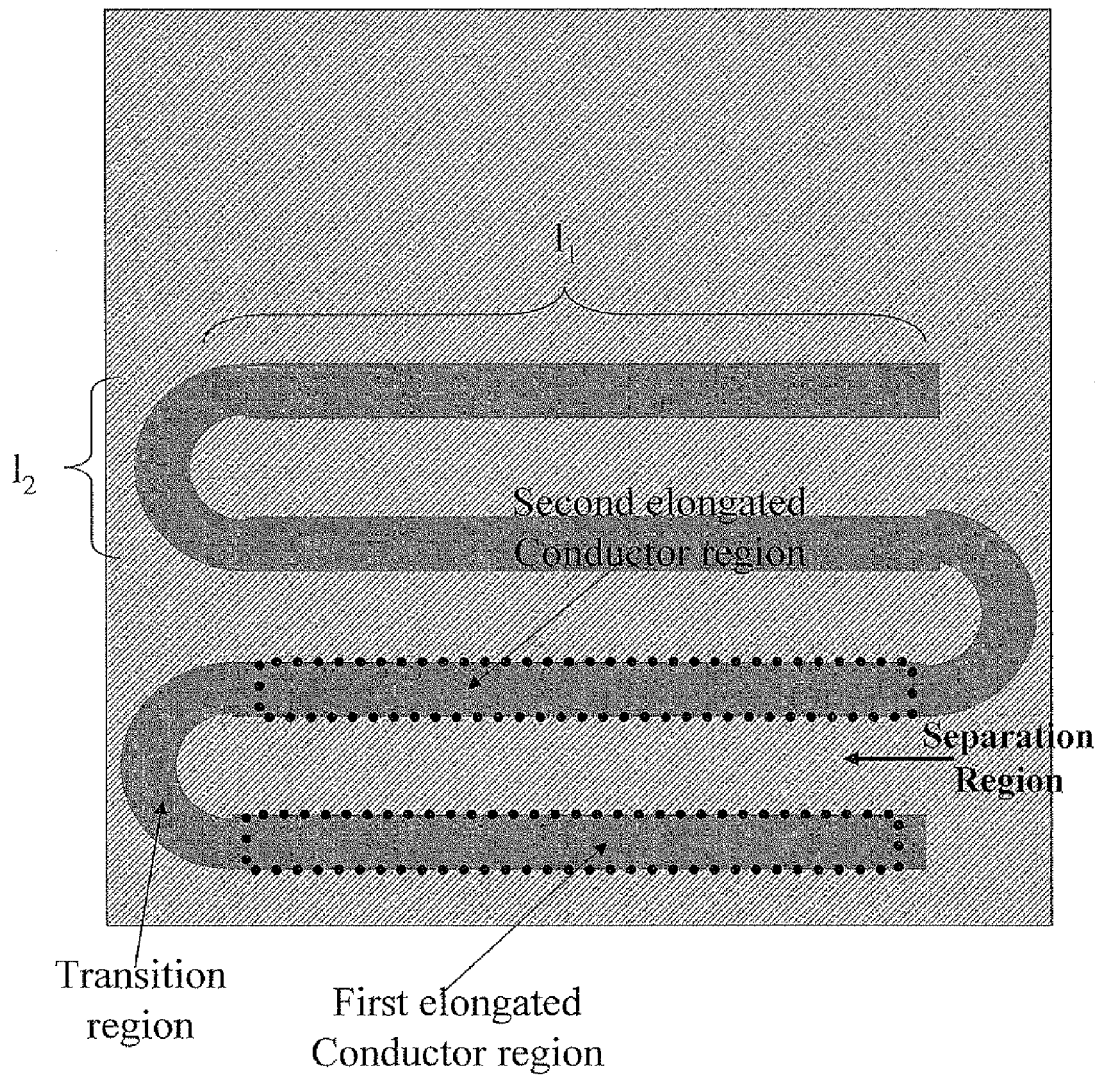

FIG. 6B provides an illustration of a "rounded" or "smoother corner" design that may be generated and/or selected and/or computer in accordance with certain embodiments of the present invention. Thus, in some embodiments of the present invention, the presently disclosed method and/or apparatus and/or computer-readable code is operative to computer a "corner rounding parameter" and/or a "number of segments associated with a corner a winding elongated conductor" and/or a corner deviation parameter indicating deviations from standard 2-segment right angle corners as illustrated in FIG. 6A.

Figure 6C:
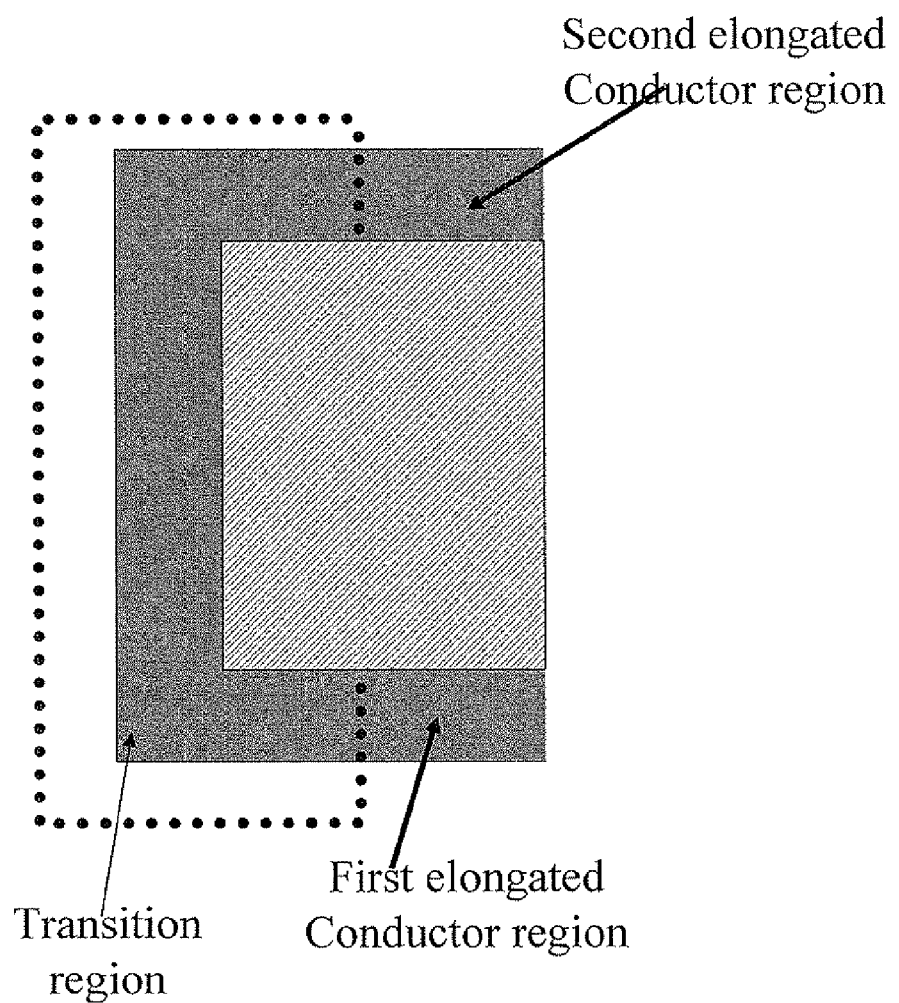

FIG. 6C provides a blown-up view of the transition region and region in proximity thereof for the strip conductor of FIG. 6A.

Figure 6D:
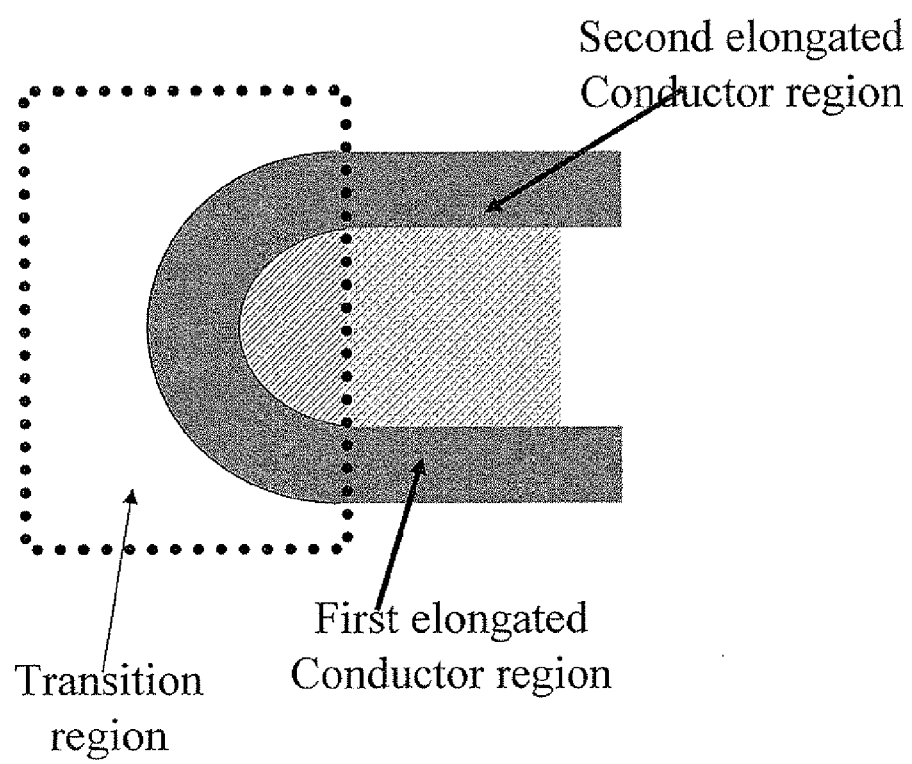

FIG. 6D provides a blown-up view of the transition region and region in proximity thereof for the strip conductor of FIG. 6B.

Not wishing to be bound by theory, it is noted that round "corners" may be difficult to micromachine, and as such, it is possible to enjoy many of the design benefits associated with "round" corners by providing corners with a plurality of segments that are intersect each other at non-right angles (for example, acute angles). In this way, a structure that is "more rounded" but still feasible to micromachine may be provided and/or computed and/or selected, thereby providing a microstructure that is less likely to fail (or having a larger mean time between failures) and improving the manufacturing yield.

Figure 6E:
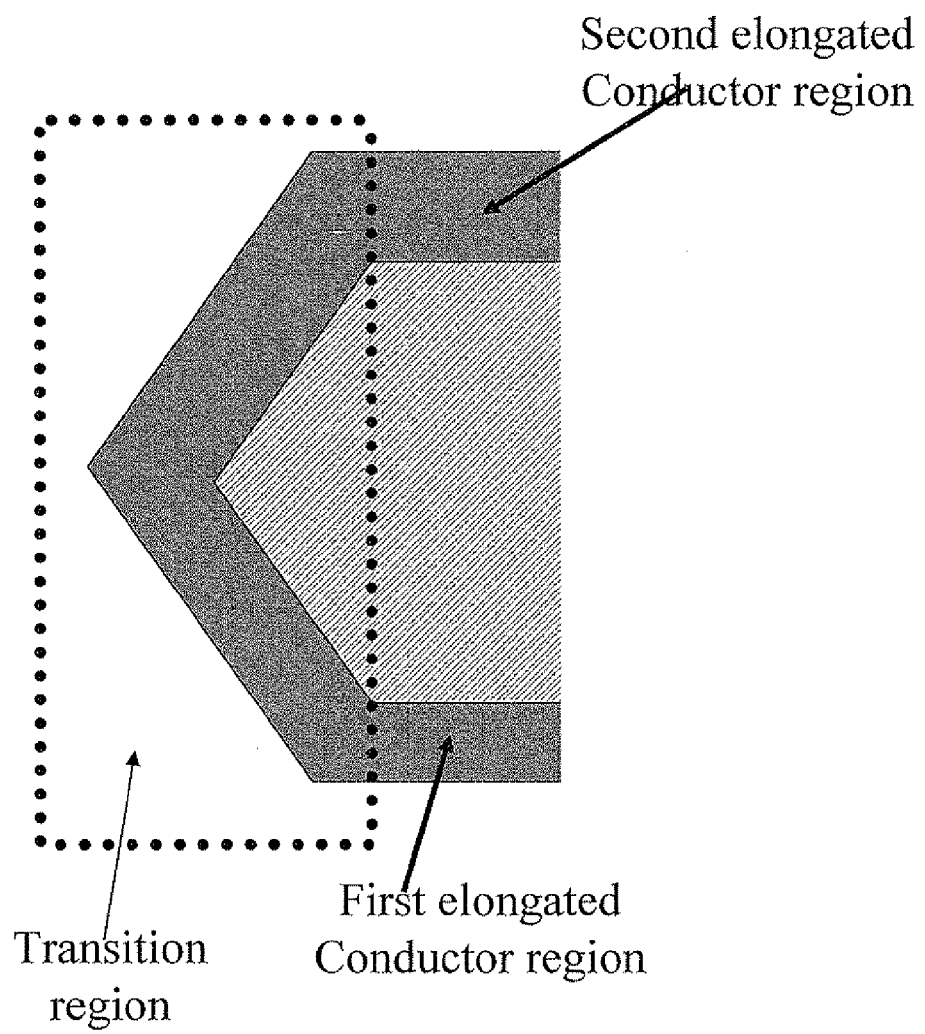

FIG. 6E provides an image of a transition region that includes at least one acute angle (unlike the transition region of FIG. 6C which only includes right angles). In some embodiments, it may be easier to micromachine the structure of FIG. 6E than the structure of FIG. 6D. It is appreciated that the structure of FIG. 6E is "rounded" to a greater degree than the structure of FIG. 6C, but to a lesser degree than the structure of FIG. 6D. In some embodiments, the presently disclosed apparatus and/or method includes computing a shape of a transition region, and in particular, a degree of "roundedness" of a given transition region.

Figure 7A:
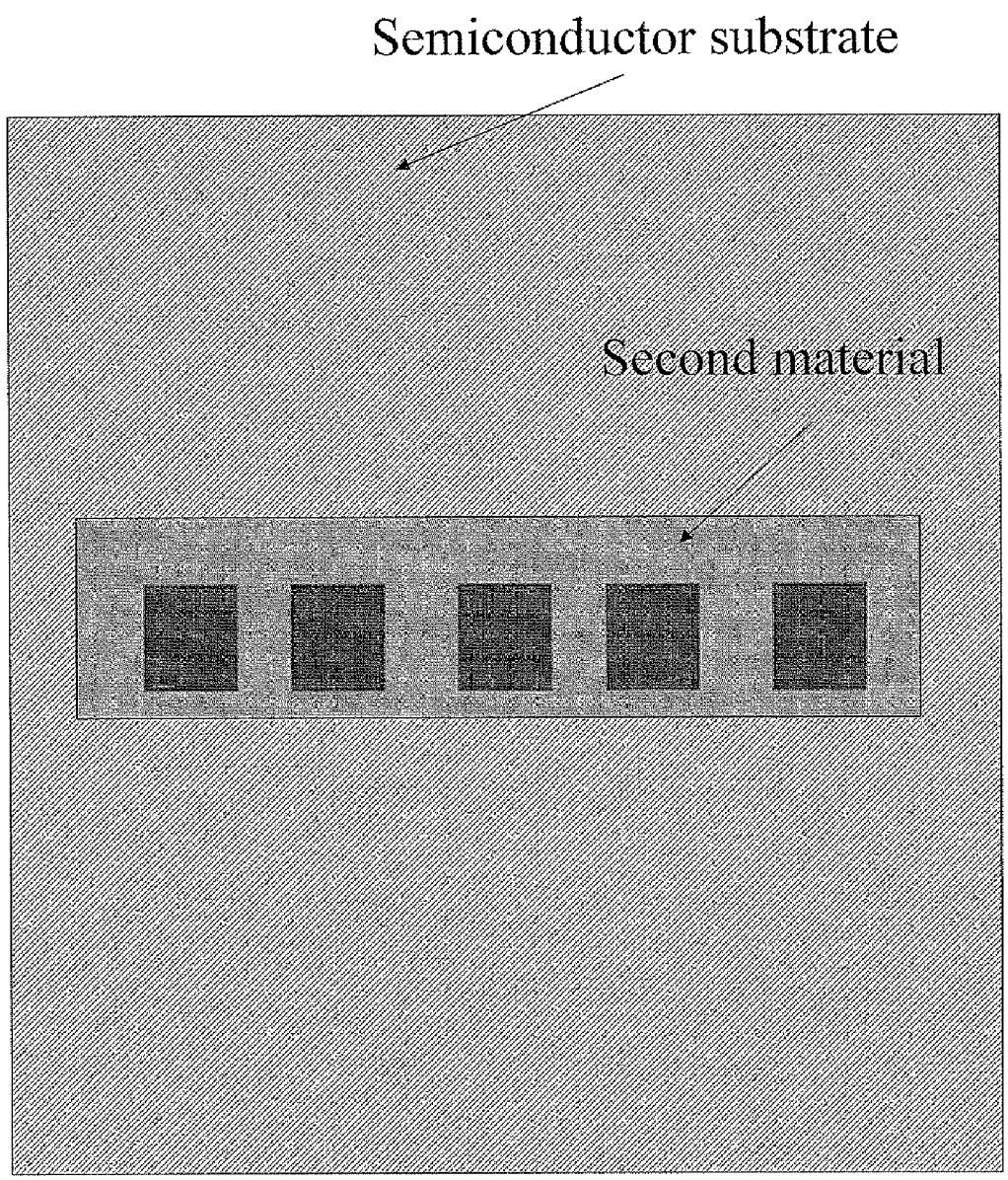
FIGS. 7A-7B illustrate exemplary arrays of current-bearing microstructure (for example, vias or contacts) in accordance with exemplary embodiments of the present invention.

FIG. 7A provides an image of "an array of vias and/or contacts" (each via is typically a conductor such as a pure metal and/or an alloy metal) embedded within a second material (typically, but not always a doped semiconductor) which is embodied in a semiconductor substrate.

Figure 7B:
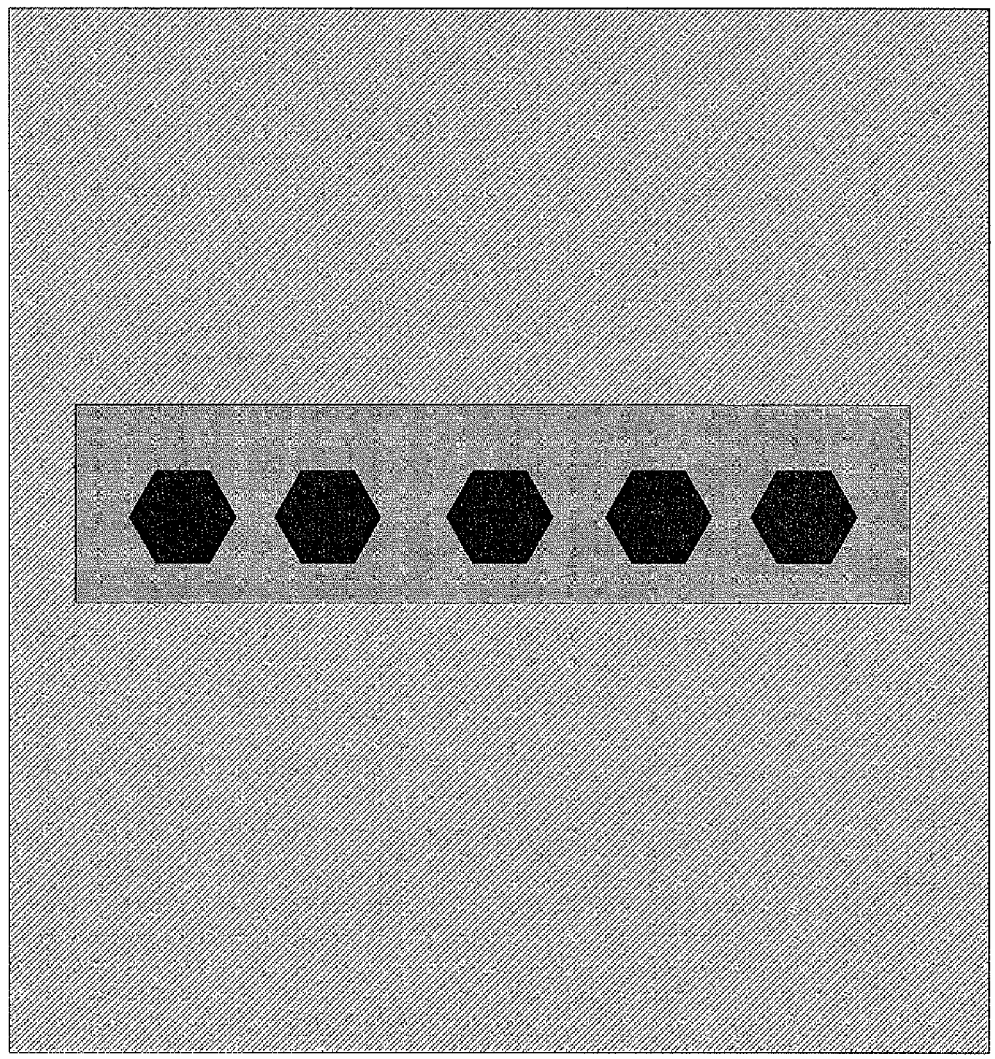

The present inventor is now disclosing that it may be advantageous, in certain circumstances, to prefer vias that have different shapes, for example, "more rounded" vias, in order to provide a more robust integrated circuit that is less susceptible to device failure. Not wishing to be bound by theory, it is noted that circular vias may be difficult to micromachine, and as such, it may be possible to enjoy many of the design benefits associated with "circular" corners by providing polygon vias (N sided structures, where N>4), as illustrated in FIG. 7B for N=6, as such a structure may be more feasible to micromachine.

Thus, in some embodiments, the presently disclosed method and/or apparatus and/or computer readable code for integrated circuit design may calculate and/or determine a number of sides of a contact and/or via and/or determine a degree of "roundness" of a contact and/or via.

I) Quiescent Current Effects

It is well known that quiescent current exists in integrated circuits. Previously, these effects were thought of as irrelevant when designing integrated circuits (in particular, effecting P & R operations). The present inventor is now disclosing that the microcurrent levels are influenced by the geometries of the microstructures of a given integrated circuit. Furthermore, there are many situations where quiescent current may damage the physical structure (for example, lattice structure) of the semiconducting or conducting material. As such, quiescent current may induce damage (i.e. mechanical damage) to the conducting material. In certain situations, structures that have more mechanical stability or other qualities may be preferred in order to make a structure more stable against quiescent. In some embodiments, structures that provide less quiescent current may also be provided.

Thus, in some embodiments, computing a layout structure and/or analyzing a failure susceptibility of a given layout structure includes computing a quiescent current in one or more locations of the integrated circuit.

Exemplary Apparatus for Computing at Least One of a Layout Structure and a Score for a Given Integrated Circuit The present invention provides methods and apparatus for computing layout structure and/or a score indicative of susceptibility of a given layout structure to failure and/or indicative of a yield during manufacturing of an integrated circuit.

It is noted that this may be implemented in hardware (for example, including programmable gate arrays or any other electronic circuitry), software or any combination thereof. In some embodiments, the presently disclosed apparatus and method are implemented using the computer illustrated in FIG. 8A.

Figure 8A:
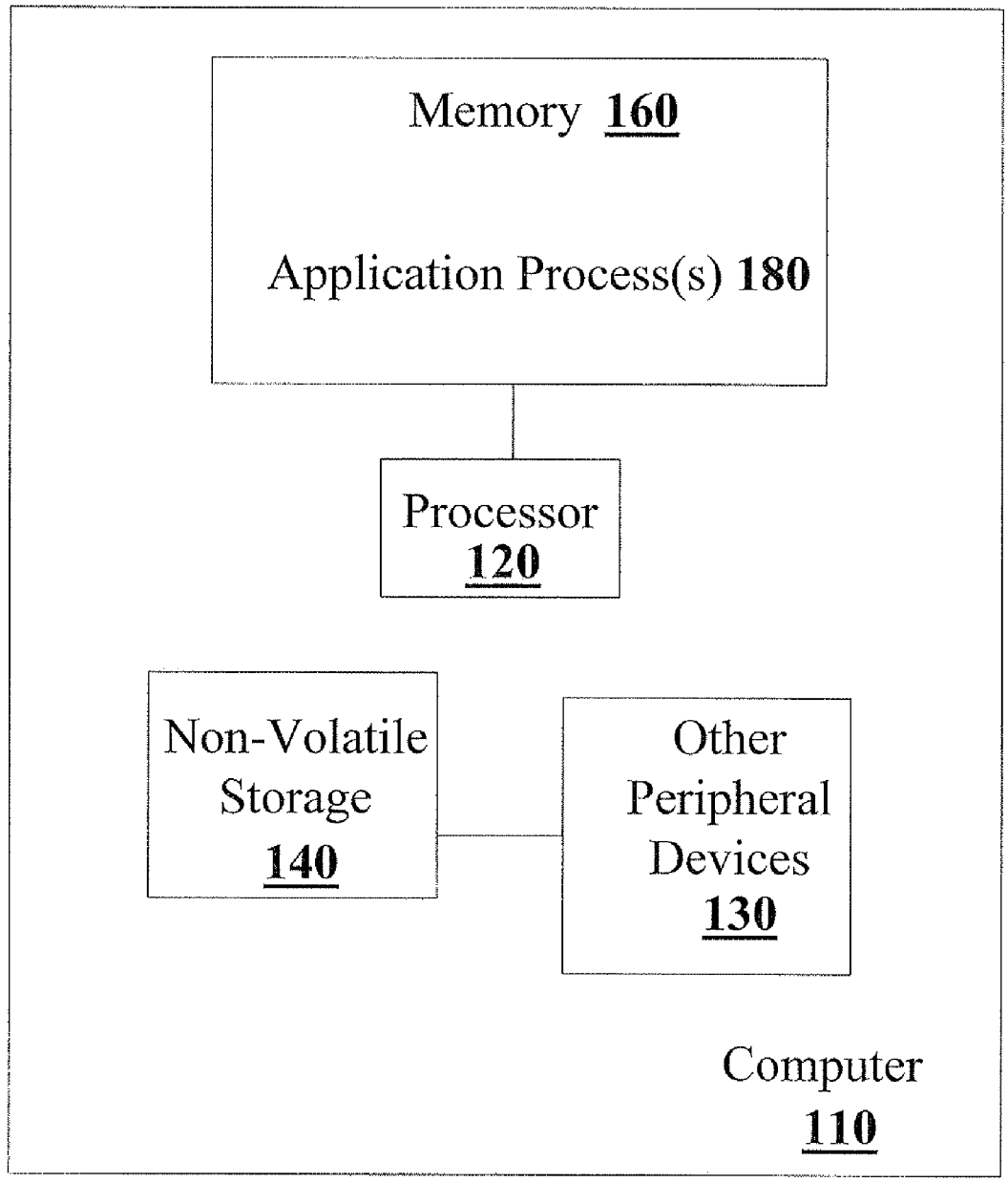
FIGS. 8A-8B provide illustrations of exemplary apparatus according to exemplary embodiments of the present invention.
Figure 8B:
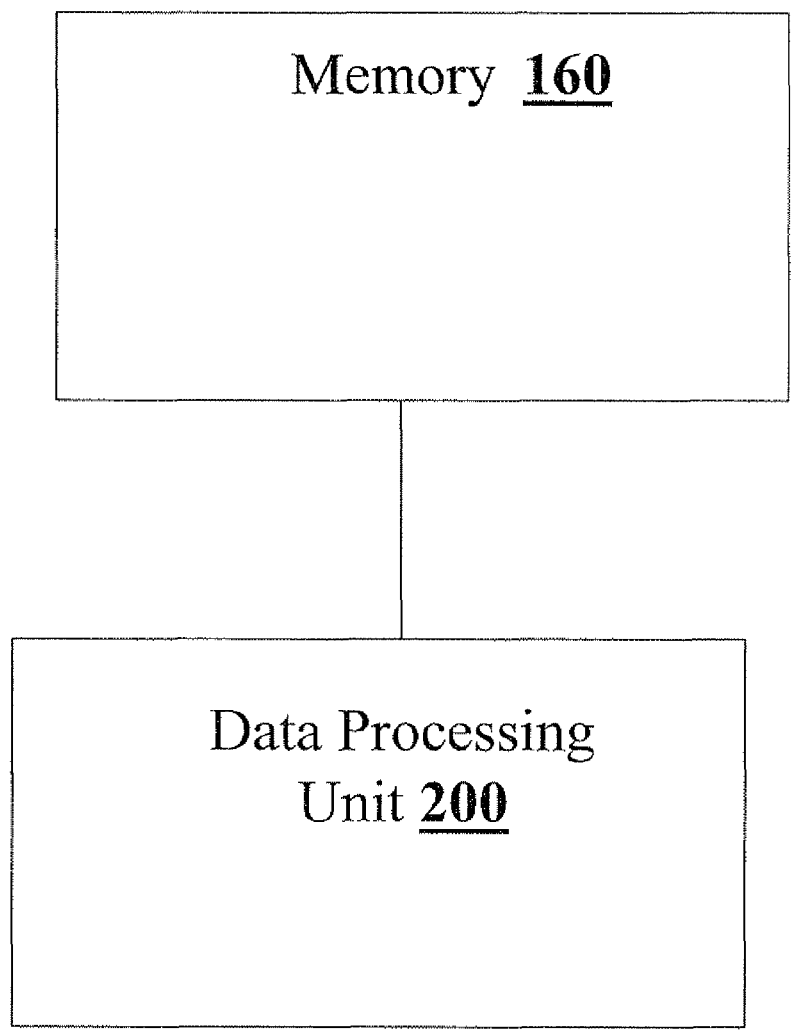

The exemplary computer 110 includes a memory 160 (for example, volatile and/or non-volatile memory) in which an applications process 180 resides (for example, a process for computing a parameter related to design and/or analysis of integrated circuits). In the example of FIG. 8A, the computer is a processor 120 (for example, for executing instructions related to design and/or analysis of integrated circuits), non-volatile storage 140, and other peripheral devices 130. It is noted that the device of FIG. 8A is only an example, and that the presently disclosed methods and apparatus may be implemented using any combination of hardware and software (for example, as in FIG. 8B where the apparatus includes a memory 160 (any combination of volatile and/or non-volatile) and a data processing unit 200 (for example, including processor 120).

Figure 9A:
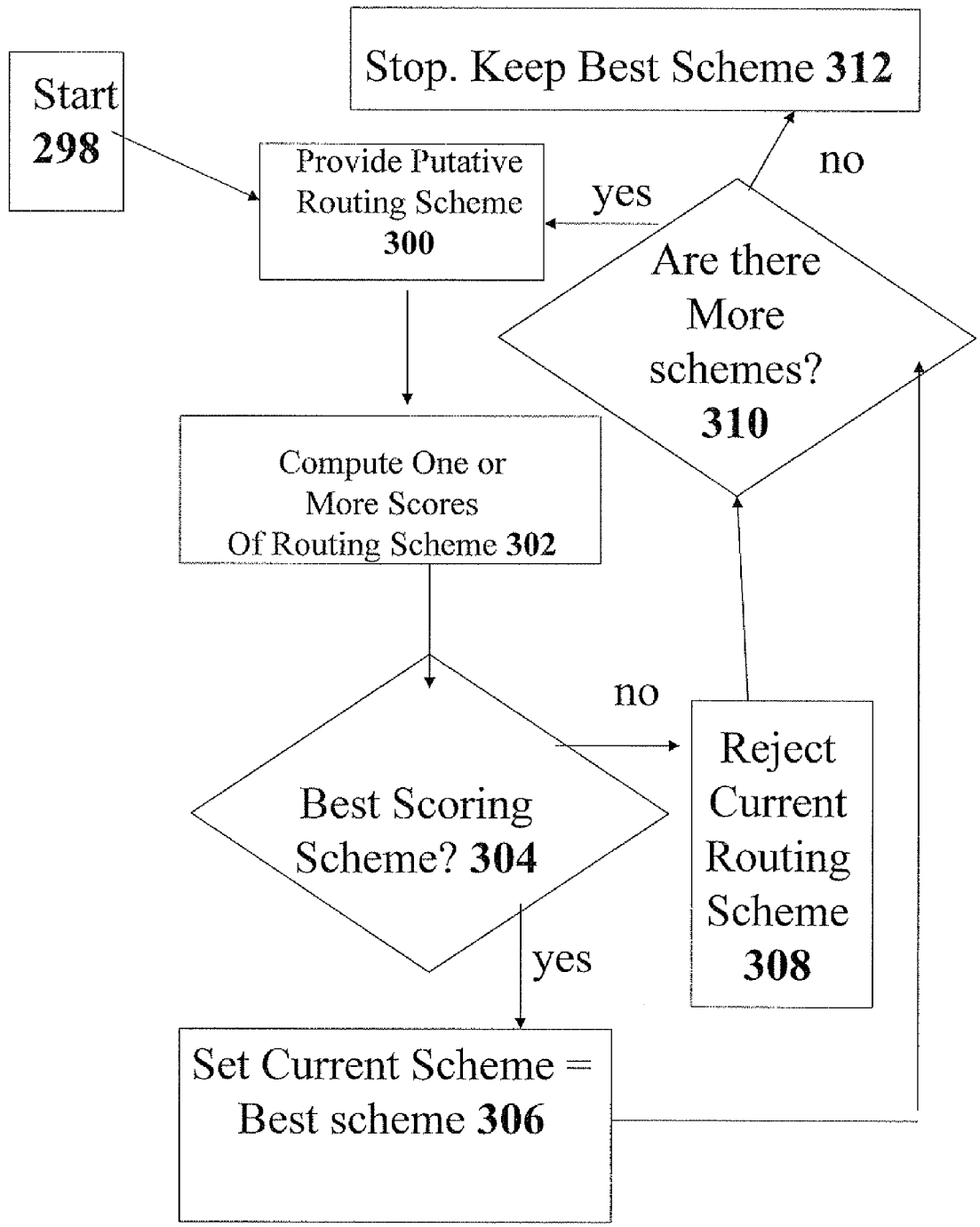
FIGS. 9A-9B provide illustrations of exemplary methods according to exemplary embodiments of the present invention.
Figure 9B:
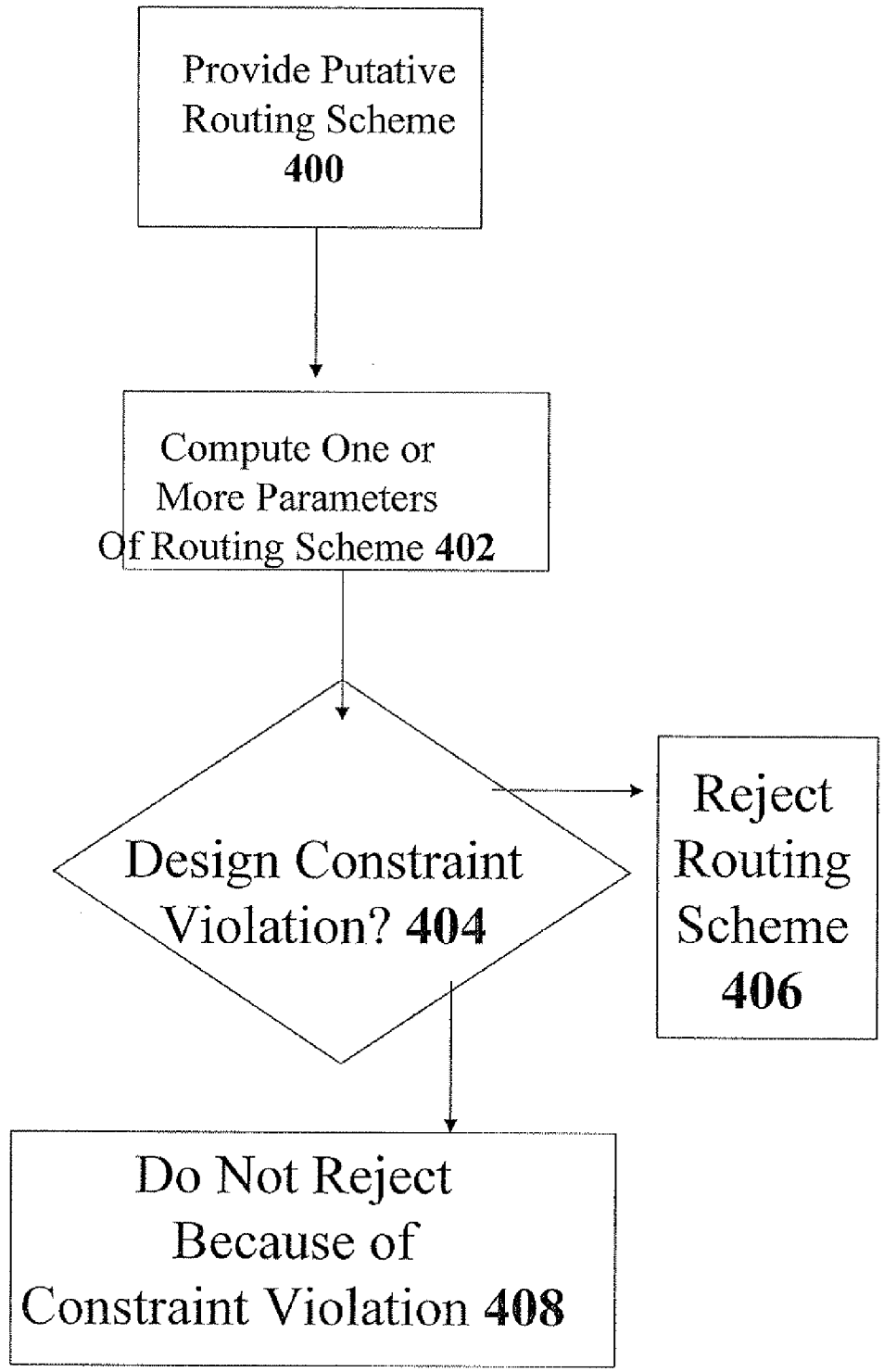

FIGS. 9A-9B provide examples of non-limiting routines provided by the present invention. In some embodiments, a routing scheme may be computed by searching the "space" of possible routing schemes using any search routine known in the art, for example, genetic algorithms. Thus, according to some embodiments, after starting the routine 298, a putative routing scheme 300 (i.e. a physical P & R of an integral circuit) is provided, and one or more scores related to putative routing scheme (for example, indicative of susceptibility to failure, for example, indicative of a mean time between failures and/or indicative of a yield in manufacturing) is computed 302. One goal is to choose the routing scheme with the "best" scoring 304 (i.e. the "best scoring scheme")—the skilled artisan knows how to order which scores are better than others. Thus, is the currently scored scheme (which receives on or more scores) is the best scoring, this scheme is denoted as the best scheme 306. Otherwise, the current routing scheme may be rejected 308. This process is repeated as long as there are more schemes 310 to be analyzed. After all the schemes have been analyzed, the best scheme is kept 312.

It is appreciated that the processes of FIGS. 9A-9B may be modified and/or combined.

FIG. 9B provides a design routine according to some embodiments of the present invention. For a putative routing scheme 400, one or more parameters are computed 402 (for example, local current or local any other parameter at one or more locations in the integrated circuit). If there is a design constraint violation 404 (for example, a current that exceeds a maximum permitted current, or a pulse energy that exceeds a maximum permitted pulse energy, or any other design constraint violation), the routing scheme is rejected 406. Otherwise, it is possible 408 to consider the routing scheme.

It is noted that in some embodiments, a layout structure is "computed in accordance with" a physical parameter. In some non-limiting embodiments, this means that the parameter may be used to score a given layout structure. In one example, a scoring function is defined for a given layout structure, and computing one or more parameters may be indicative of a physical property of an integrated circuit or a portion thereof. In some embodiments, this physical property may manifest itself during "use" of the integrated circuit, i.e. when current is flowing through the integrated circuit. Thus, in order to compute the physical property, it may be necessary to compute one or more parameters, for example, a current in one or more locations of the integrated circuit, a local pulse energy, etc. In some non-limiting embodiments, one or more design constraints are imposed upon a putative layout structure, and in order to calculate these design constraints, it is necessary to compute one or more physical properties disclosed herein. In some embodiments, a computed geometric property of an integrated circuit may indicative of a susceptibility of the integrated circuit to failure during use.

As used herein, "localized physical parameter" for example, a local current, a local pulse energy (i.e. the energy associated with a single pulse of driving current at the one or more locations), a local electrical surge parameter (for example, associated with DEVICE-On and/or DEVICE-Off events), a local electrical signal interference parameter (for example, associated with DEVICE-On and/or DEVICE-Off events), a local time derivative (for example, SLEW or parameter associated with higher order time derivatives of voltage), and any other "localized" or "local" physical parameters refers to a parameter at one or more location within the integrated circuit. In some embodiments, the parameter is determined at a plurality of locations in the integrated circuit, for example, a plurality of locations in a single elongated stretch of conductor and/or intersection regions and/or transition region.

Certain embodiments of the present invention relate to a "current parameter" or "energy parameter" or time derivative parameter or "X parameter" where X is a physical phenomena. In some embodiments, the "current parameter" or other parameter is the current (or any physical phenomenon X) per unit area, or per unit volume, or any other function of the "current" (or physical phenomena X).

Although design of integrated circuits in accordance with failure susceptibility and/or yield was discussed, it is appreciated that these considerations may be combined with other design considerations (for example, heat or area). In some embodiments, there are contradicting design considerations, and a scoring system to handle these contradictions may be provided.

APPENDIX A

General Theoretical Discussion

The following non-limiting theoretical discussion of certain principles of physical electronics is now provided Conducting structures are isolated and geometrically measured.

Since the allowable current density is a function of the amount of conductor line that is being used, tables are prepared denoting the current density limits for various structures & total lengths of conducting lines at that value of current density.

Extreme value lognormal statistics are used to accomplish the optimized conducting structure.

This corresponds to "weakest link in a chain" statistics where the individual links are long normally distributed.

The probability of micro failure for n elements in time, t, is expressed as:

$$P_F(n, t) = 1 - \prod_{i=1}^{n} (1 - P_{fi}(t))^n \quad (A-1)$$

where $P_{fi}(t)$ is the probability of micro failure of the ith element.

If all elements are identical, then eqn (A-1) reduces to $$P_f(n,t) = 1 - (1 - P_f(t))^n \quad (A-2)$$

Where $P_f(t)$ is the failure probability of a single element. $P_f(t)$ is assumed to be log normally distributed, expressed as $$P_F(n, t) = \frac{\sigma}{\sqrt{2}\,\pi \ln(t_{50}/t)} \exp\left[-\frac{\ln(t_{50}/t)}{\sqrt{2}\,\sigma}\right] \quad (A-3)$$

In the description and claims of the present application, each of the verbs, "comprise" "include" and "have", and conjugates thereof, are used to indicate that the object or objects of the verb are not necessarily a complete listing of members, components, elements or parts of the subject or subjects of the verb.

All references cited herein are incorporated by reference in their entirety. Citation of a reference does not constitute an admission that the reference is prior art.

The articles "a" and "an" are used herein to refer to one or to more than one (i.e., to at least one) of the grammatical object of the article. By way of example, "an element" means one element or more than one element.

The term "including" is used herein to mean, and is used interchangeably with, the phrase "including but not limited" to.

The term "or" is used herein to mean, and is used interchangeably with, the term "and/or," unless context clearly indicates otherwise.

The term "such as" is used herein to mean, and is used interchangeably, with the phrase "such as but not limited to".

The present invention has been described using detailed descriptions of embodiments thereof that are provided by way of example and are not intended to limit the scope of the invention. The described embodiments comprise different features, not all of which are required in all embodiments of the invention. Some embodiments of the present invention utilize only some of the features or possible combinations of the features. Variations of embodiments of the present invention that are described and embodiments of the present invention comprising different combinations of features noted in the described embodiments will occur to persons of the art.

What is claimed is:

1. A method of computing a layout structure, the method comprising:
   a) storing a netlist of an electronic circuit in a memory; and
   b) computing from said netlist a layout structure of an integrated circuit in accordance with at least one of:
      i) a relationship between a local current parameter within a conductor and a length of the conductor;
      ii) a function of a local time derivative of a voltage;
      iii) a local pulse energy;
      iv) an induced stress of one or more structures of said integrated circuit;
      v) a local electrical surge parameter;
      vi) a local electrical signal interference pattern;
      vii) a relativistic electro-migration parameter; and
      viii) a parameter indicative of quiescent current.

2. The method of claim 1 wherein said layout structure is computed in accordance with a relationship between one of current through and a current density at one or more locations in a conductor and one of a maximum permissible current and a maximum permissible current density at said one or more locations, and one of said maximum permissible current and said maximum permissible current density depends at least in part on said length of said conductor.

3. The method of claim 2 wherein at least one of said maximum permissible current and said maximum permissible current density decreases as said length of said conductor increases.

4. The method of claim 2 wherein said conductor is a strip conductor having a plurality of strip regions that are each substantially parallel to each other, and said length is a strip length of said strip conductor.

5. The method of claim 4 wherein a total volume of said strip regions is a majority of a volume of said strip conductor.

6. The method of claim 4 wherein a total volume of said strip regions is at least 70% of a volume of said strip conductor.

7. The method of claim 1 wherein said function of said local time-derivative is indicative of a slew rate at one or more locations.

8. The method of claim 1 wherein said netlist is provided in a hardware description language.

9. The method of claim 1 wherein said electronic circuit includes any combination of components selected from the group consisting of digital components, analog components, RF components, and optical components.

10. A method of computing a layout structure, the method comprising:
    a) storing a netlist of an electronic circuit in a memory;
    b) computing from said netlist a layout structure of an integrated circuit, wherein said computing includes effecting at least one shape alteration selected from the group consisting of:
       i) change of a shape of an intersection region between two substantially perpendicular elongated conductors,
       ii) changing, from rectangular to non-rectangular, a shape of at least one of current-bearing structure selected from the group consisting of a via and a contact, and
       iii) changing, from rectangular to non-rectangular, a shape of a transition region between substantially parallel elongated conductors embedded in a semi-conductor substrate.

11. The method of claim 10 wherein said alteration includes changing an angle between two lines differentiating a border between one of said conductors and a semi-conductor substrate in said intersection region from perpendicular to oblique.

12. The method of claim 11 wherein an angle between said oblique lines is at most 15 degrees.

13. The method of claim 10 wherein said alteration includes imposing a curvature on at least a portion of said transition region.

14. The method of claim 10 wherein said changing of said shape of said current-bearing structure includes increasing a number of sides of said current-bearing structure.

15. The method of claim 10 wherein said shape alteration is effected in accordance with a relativistic electromigration parameter.

16. A method of computing a scoring parameter indicative of at least one of a yield and a mean time between failures of an integrated circuit, the method comprising:
    a) storing a description of a physical structure of said integrated circuit in a memory;
    b) computing the scoring parameter from said description of said integrated circuit in accordance with at least one of:
       i) a relationship between a local current parameter in a conductor and a length of the conductor;
       ii) a function of a local time derivative of a voltage;
       iii) a local pulse energy;
       iv) an induced stress of one or more structures of said integrated circuit;
       v) a local electrical surge parameter;
       vi) a local electrical signal interference pattern;
       vii) a relativistic electro-migration parameter; and
       viii) a parameter indicative of quiescent current.

17. A method of effecting placement and routing of an integrated circuit, the method comprising:
    a) storing a netlist of the integrated circuit in a memory;
    b) generating a plurality of candidate placement-and-routing-solutions for said netlist;
    c) for each said candidate placement-and routing-solution, computing a respective scoring parameter indicative of at least one of a respective yield and a respective mean time between failures associated with said each candidate placement-and-routing-solution; and
    d) determining a preferred placement-and-routing from said candidate placement-and-routing-solutions and said score parameter.

18. The method of claim 17 wherein said determining includes rejecting structures with inferior said scoring parameters.

19. The method of claim 17 wherein said computing of said scoring parameter is carried out in accordance with at least one of:
    i) a relationship between a local current parameter in a conductor and a length of the conductor;
    ii) a function of a local time derivative of a voltage;
    iii) a local pulse energy;
    iv) an induced stress of one or more structures of said integrated circuit;
    v) a local electrical surge parameter;
    vi) a local electrical signal interference pattern;
    vii) a relativistic electro-migration parameter; and
    viii) a parameter indicative of quiescent current.

20. Apparatus operative to compute a layout structure, the apparatus comprising:
  a) a memory configured to store a netlist of an electronic circuit; and
  b) a data processing unit configured to compute from said netlist a layout structure of an integrated circuit in accordance with at least one of:
    i) a relationship between a local current parameter in a conductor and a length of the conductor.
    ii) a function of a local time derivative of a voltage;
    iii) a local pulse energy;
    iv) an induced stress of one or more structures of said integrated circuit;
    v) a local electrical surge parameter;
    vi) a local electrical signal interference pattern;
    vii) a relativistic electro-migration parameter; and
    viii) a parameter indicative of quiescent current.

21. Apparatus of claim 20, further comprising:
  c) a hardware specification engine for specifying said netlist.

22. Apparatus of claim 21 wherein said hardware specification engine includes a compilation engine for compiling hardware description language.

23. Apparatus operative to compute a scoring parameter indicative of at least one of a yield and a mean time between failures of an integrated circuit, the apparatus comprising:
  a) a memory configured to store description of a physical structure of said integrated circuit;
  b) a data processing unit adapted to compute the scoring parameter from said description of said integrated circuit in accordance with at least one of:
    i) a relationship between a local current parameter in a conductor and a length of the conductor;
    ii) a function of a local time derivative of a voltage;
    iii) a local pulse energy;
    iv) an induced stress of one or more structures of said integrated circuit;
    v) a local electrical surge parameter;
    vi) a local electrical signal interference pattern;
    vii) a relativistic electro-migration parameter; and
    viii) a parameter indicative of quiescent current.

24. Apparatus of claim 23, further comprising:
  c) a hardware specification engine for specifying a netlist of said integrated circuit.

25. Apparatus of claim 24 wherein said hardware specification engine includes a compilation engine for compiling hardware description language.

26. Apparatus operative to effect placement and routing of an integrated circuit, the apparatus comprising:
  a) means for providing a netlist of the integrated circuit; and
  b) a data processing unit adapted configured to:
    i) generate a plurality of candidate placement-and routing-solutions for said netlist;
    ii) for each said candidate placement-and routing-solution, compute a respective scoring parameter indicative of at least one of a respective yield and a respective mean time between failures associated with said each candidate placement-and-routing-solution; and
    iii. determine a preferred placement-and-routing from said candidate placement-and-routing-solutions and said failure score parameter.

27. Apparatus of claim 26, wherein said means for providing said netlist includes a hardware specification engine for specifying said netlist.

28. Apparatus of claim 27 wherein said hardware specification engine includes a compilation engine for compiling hardware description language.

29. Apparatus of claim 26, wherein said means for providing said netlist includes a memory configured to store said netlist.

* * * * *